United States Patent
An et al.

(10) Patent No.: US 11,885,761 B2
(45) Date of Patent: Jan. 30, 2024

(54) ELECTRONIC DEVICE INCLUDING FLEXIBLE DISPLAY MODULE AND METHOD FOR DETECTING DAMAGE TO THE DISPLAY MODULE

(71) Applicant: SAMSUNG ELECTRONICS CO., LTD., Suwon-si (KR)

(72) Inventors: Jungchul An, Suwon-si (KR); Shinhyuk Yoon, Suwon-si (KR); Jaehwan Park, Suwon-si (KR); Kwonho Song, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 18/083,580

(22) Filed: Dec. 19, 2022

(65) Prior Publication Data

US 2023/0127293 A1 Apr. 27, 2023

Related U.S. Application Data

(63) Continuation of application No. PCT/KR2022/016436, filed on Oct. 26, 2022.

(30) Foreign Application Priority Data

Oct. 26, 2021 (KR) .................. 10-2021-0143400

(51) Int. Cl.
*G01N 27/02* (2006.01)
*H05K 5/02* (2006.01)
(Continued)

(52) U.S. Cl.
CPC .......... *G01N 27/02* (2013.01); *G01N 27/046* (2013.01); *G06F 3/0412* (2013.01);
(Continued)

(58) Field of Classification Search
CPC .... G02F 1/136259; G09G 3/00; G09G 3/006; G09G 3/035; G09G 5/10;
(Continued)

(56) References Cited

U.S. PATENT DOCUMENTS 10,102,785 B2 10/2018 Kim
10,522,431 B2 12/2019 Kim et al.
(Continued)

FOREIGN PATENT DOCUMENTS

JP 2021061140 A 4/2021
JP 6935607 B2 8/2021
(Continued)

OTHER PUBLICATIONS

International Search Report dated Feb. 8, 2023 for PCT/KR2022/016436.

*Primary Examiner* — Nelson M Rosario
(74) *Attorney, Agent, or Firm* — CANTOR COLBURN LLP

(57) ABSTRACT

An electronic device include: a first housing; a second housing; a display module including a flexible substrate, a TFT layer on the flexible substrate, a protection layer on the TFT layer, and a deformation region which deforms as a relative position between the first housing and the second housing changes; a bending portion including a first layer integral with the flexible substrate and bent, and a second layer integral with the TFT layer, bent and laminated on the first layer; a display driver IC (DDI) in the bending portion; a touch wire on the protection layer to be connected to a touch circuit; and a detection wire on the protection layer in the deformation region and having an electrical value changeable by physical damage to the protection layer. The detection wire extends from the protection layer to the second layer so as to be electrically connected to the DDI.

19 Claims, 18 Drawing Sheets

(51) Int. Cl.
*G06F 3/041* (2006.01)
*G01N 27/04* (2006.01)
*H10K 50/844* (2023.01)
*H10K 59/12* (2023.01)

(52) U.S. Cl.
CPC ......... H05K 5/0226 (2013.01); H10K 50/844 (2023.02); *G06F 2203/04107* (2013.01); *H10K 59/12* (2023.02)

(58) Field of Classification Search
CPC ....... G09G 2300/0426; G09G 2300/08; G09G 2330/12; G09G 2354/00; G09G 2380/02; G09G 3/20; G09G 3/3225; H01L 27/1218; H01L 27/124; H10K 50/844; H10K 50/8445; H10K 59/131; H10K 71/00; H10K 77/111; H10K 2102/311; H10K 2102/351; Y02E 10/549; Y02P 70/50
See application file for complete search history.

(56) References Cited

U.S. PATENT DOCUMENTS

| | | | |
|---|---|---|---|
| 10,878,728 | B2 | 12/2020 | Yoon |
| 10,978,494 | B2 | 4/2021 | An et al. |
| 11,341,875 | B2 | 5/2022 | Lee et al. |
| 2018/0123060 | A1* | 5/2018 | Jang ............... H10K 77/111 |
| 2019/0074332 | A1 | 3/2019 | Kim et al. |
| 2019/0392743 | A1* | 12/2019 | Lee .................... G09G 3/00 |
| 2020/0274098 | A1 | 8/2020 | Shin et al. |
| 2020/0379595 | A1 | 12/2020 | Kim |
| 2021/0143225 | A1 | 5/2021 | Park et al. |
| 2022/0141969 | A1 | 5/2022 | Cho et al. |
| 2023/0244020 | A1 | 8/2023 | Yano et al. |

FOREIGN PATENT DOCUMENTS

| | | |
|---|---|---|
| KR | 10-2020-0007366 A | 1/2020 |
| KR | 10-2020-0032295 A | 3/2020 |
| KR | 10-2020-0064573 A | 6/2020 |
| KR | 10-2020-0075410 A | 6/2020 |
| KR | 10-2020-0101220 A | 8/2020 |
| KR | 20200103240 A | 9/2020 |
| KR | 20210057856 A | 5/2021 |

* cited by examiner

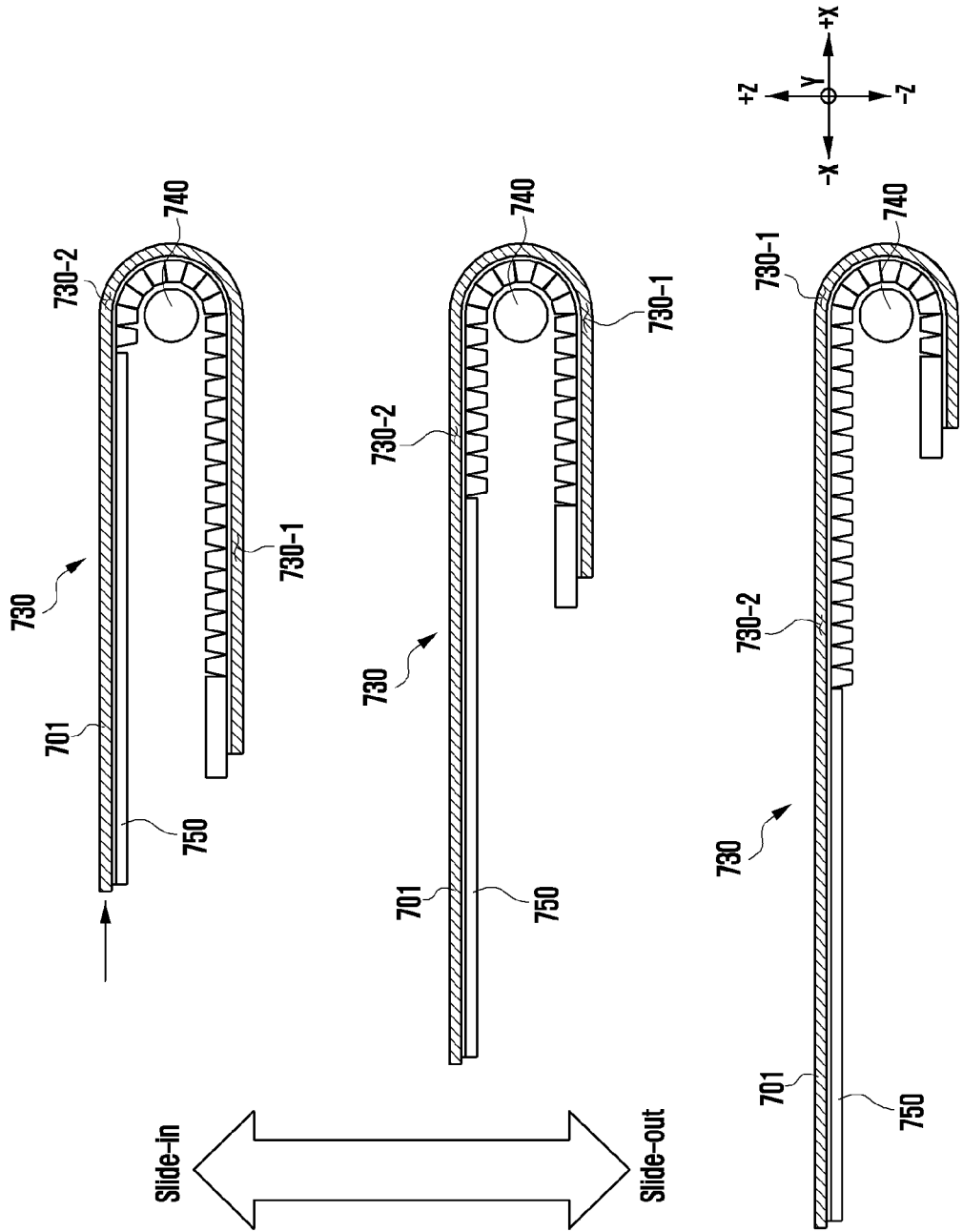

ELECTRONIC DEVICE INCLUDING FLEXIBLE DISPLAY MODULE AND METHOD FOR DETECTING DAMAGE TO THE DISPLAY MODULE

TECHNICAL FIELD

Various embodiments disclosed herein relate to an electronic device including a flexible display module, and a method for detecting damage to the flexible display module.

BACKGROUND ART

Thin film encapsulation (TFE) may be applied to a thin film transistor (TFT) that constitutes a display in order to protect the TFT from moisture or air. The TFE is disposed on the TFT to have a small thickness, and may be vulnerable to deformation such as bending and rolling

DISCLOSURE OF INVENTION

Technical Problem

Thin film encapsulation (TFE) may be applied to a thin film transistor (TFT) that constitutes a display of an electronic device in order to protect the TFT from moisture or air. The TFE may deform in response to a folding or rolling operation of the electronic device. In particular, the closer to the folding or rolling area of the electronic device, the larger the amount of deformation of the TFE. The TFE is disposed on the TFT to have a small thickness, and may be vulnerable to deformation such as bending and rolling. The display of the electronic device may have an adhesive disposed thereon so as to reduce the amount of deformation of the TFE occurring during a folding or rolling operation of the electronic device. If the electronic device is exposed to a low-temperature environment, the adhesive may solidify. In such a case, physical damage may occur to the TFE because the adhesive does not reduce the amount of deformation of the TFE during a folding or rolling operation of the electronic device.

Meanwhile, it has been impossible to identify whether the cause of detachment of the TFE from the TFT is an external impact or exposure of the electronic device to a low-temperature environment. In such a case, it could be considered that exposure of the electronic device to a low-temperature environment has caused physical damage to the protective layer. As a result, the electronic device may be deemed defective, and the manufacturer may have an incurred cost for the customer service.

Various embodiments disclosed herein may provide a scheme capable of solving or alleviating the above-mentioned problems.

Solution to Problem

An electronic device according to various embodiments disclosed herein includes: a first housing, a second housing connected to the first housing to be variable in relative position with respect to the first housing, a display module including a flexible substrate, a thin film transistor (TFT) layer laminated on the flexible substrate, a protection layer laminated on the TFT layer, and a deformation region which deforms as the relative position of the second housing with respect to the first housing changes, a bending portion including a first layer which is integrally configured with the flexible substrate and at least a part of which is bent to extend to a rear surface of the display module, and a second layer which is integrally configured with the TFT layer, at least a part of which is bent to extend to the rear surface of the display module, and which is laminated on the first layer, a display driver IC (DDI) disposed in the bending portion, a touch wire disposed on the protection layer to be connected to a touch circuit of the electronic device, and a detection wire disposed on the protection layer in the deformation region and configured to have an electrical value changeable depending on physical damage to the protection layer, where the detection wire extends from the protection layer to the second layer of the bending portion so as to be electrically connected to the display driver IC.

A method for detecting damage to a display module according to various embodiments disclosed herein includes: receiving an electrical value of a detection wire arranged in a deformation region of the display module, identifying whether the electrical value satisfies a preset value, receiving, based on the identifying, an internal temperature value of the electronic device which is detected by a temperature sensor, and storing the electrical value and the temperature value in a memory.

Advantageous Effects of Invention

According to various embodiments disclosed herein, a configuration may be provided such that it is possible to identify whether TFE has been physically damaged. In addition, a scheme may be provided such that it is possible to determine whether the cause of damage to the TFE is exposure of the electronic device to a low-temperature environment.

BRIEF DESCRIPTION OF DRAWINGS

In connection with the description of the drawings, the same or similar reference numerals may be used for the same or similar components.

FIG. 8A to FIG. 8C are views for describing various states according to a sliding operation of an electronic device according to various embodiments disclosed herein.

MODE FOR THE INVENTION

Figure 1:
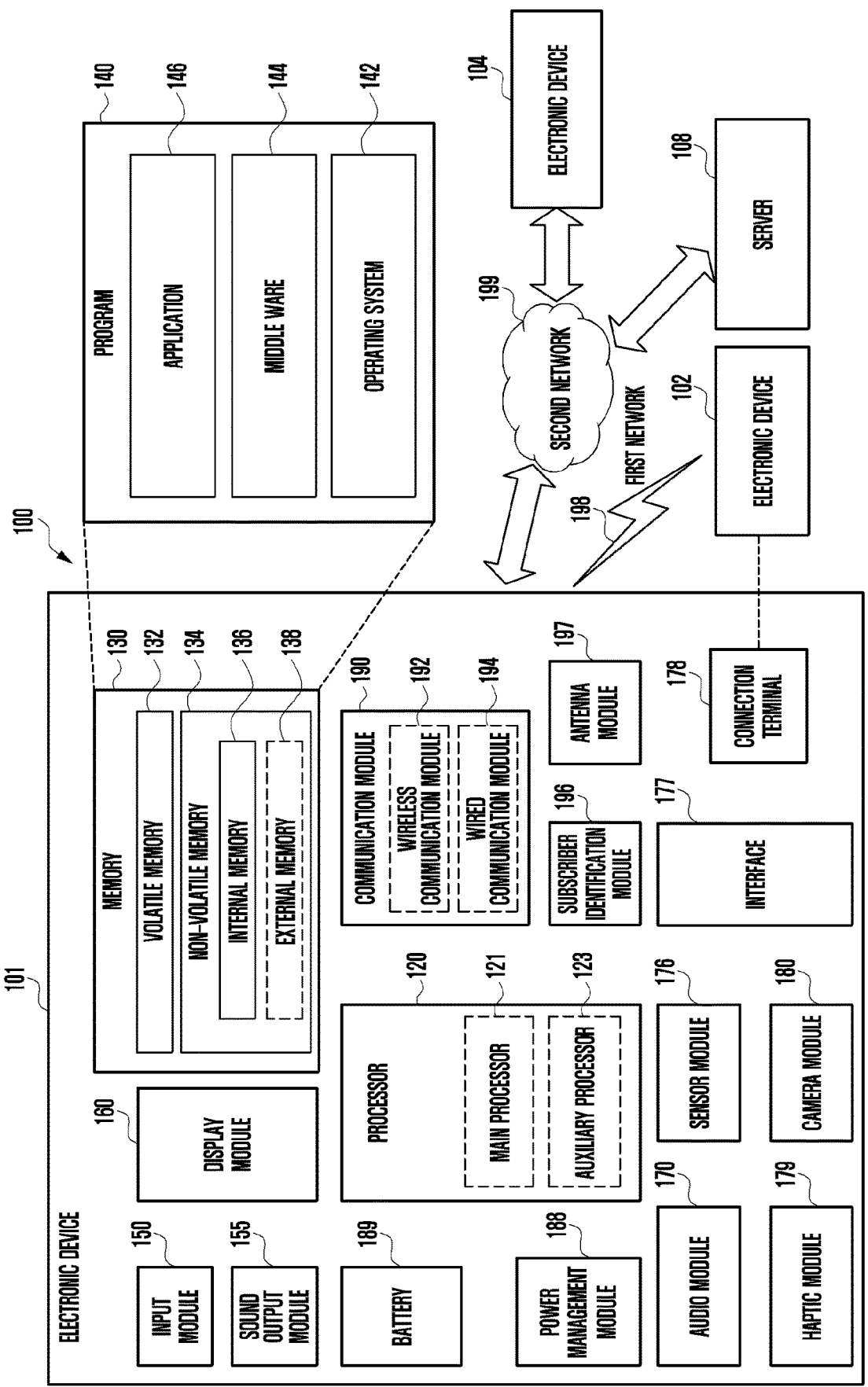
FIG. 1 is a block diagram of an electronic device in a network environment according to various embodiments.

It should be appreciated that various embodiments of the present disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
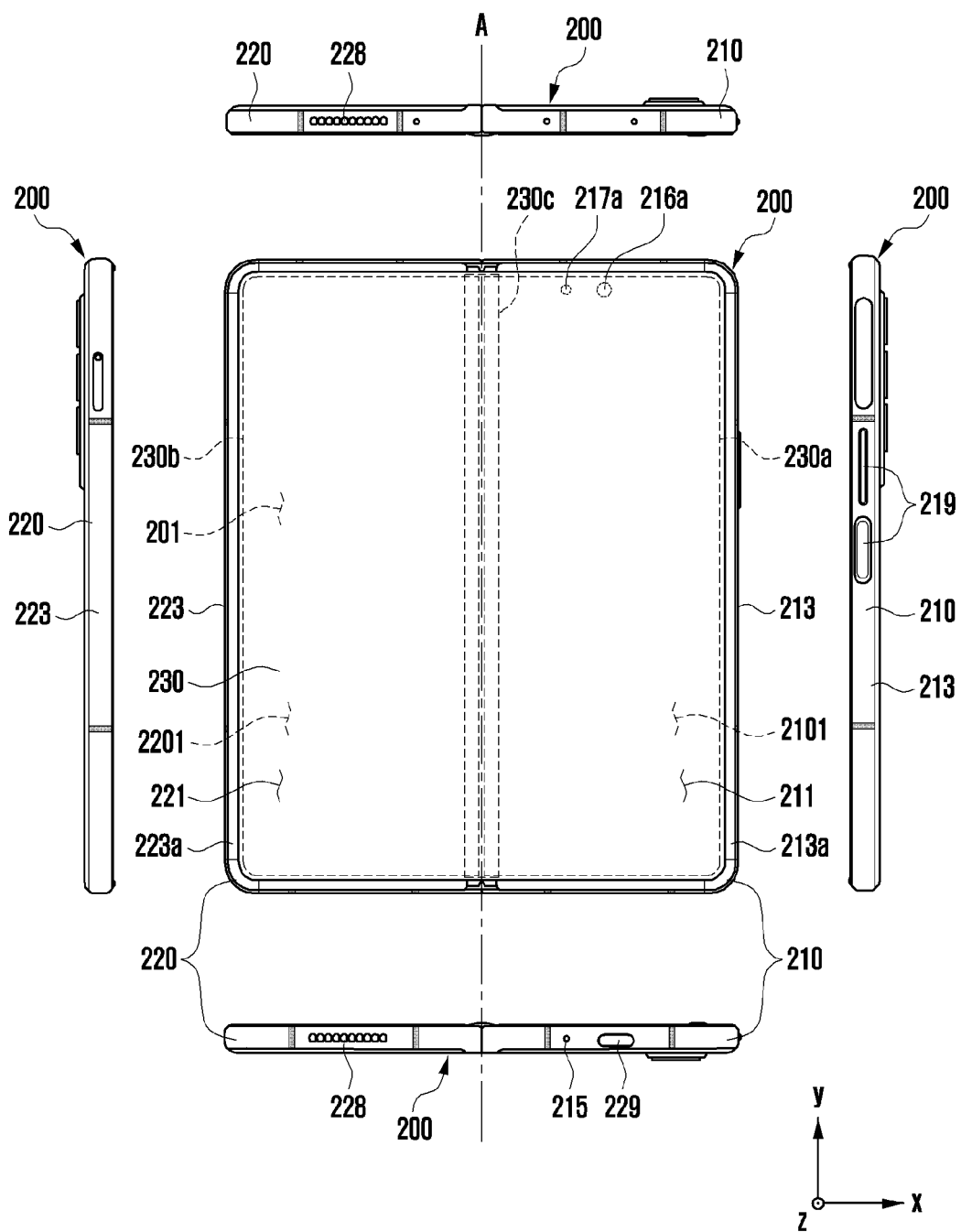
FIG. 2A and FIG. 2B are views of an electronic device in an unfolded state when viewed from the front and rear sides thereof according to various embodiments disclosed herein.
Figure 2B:
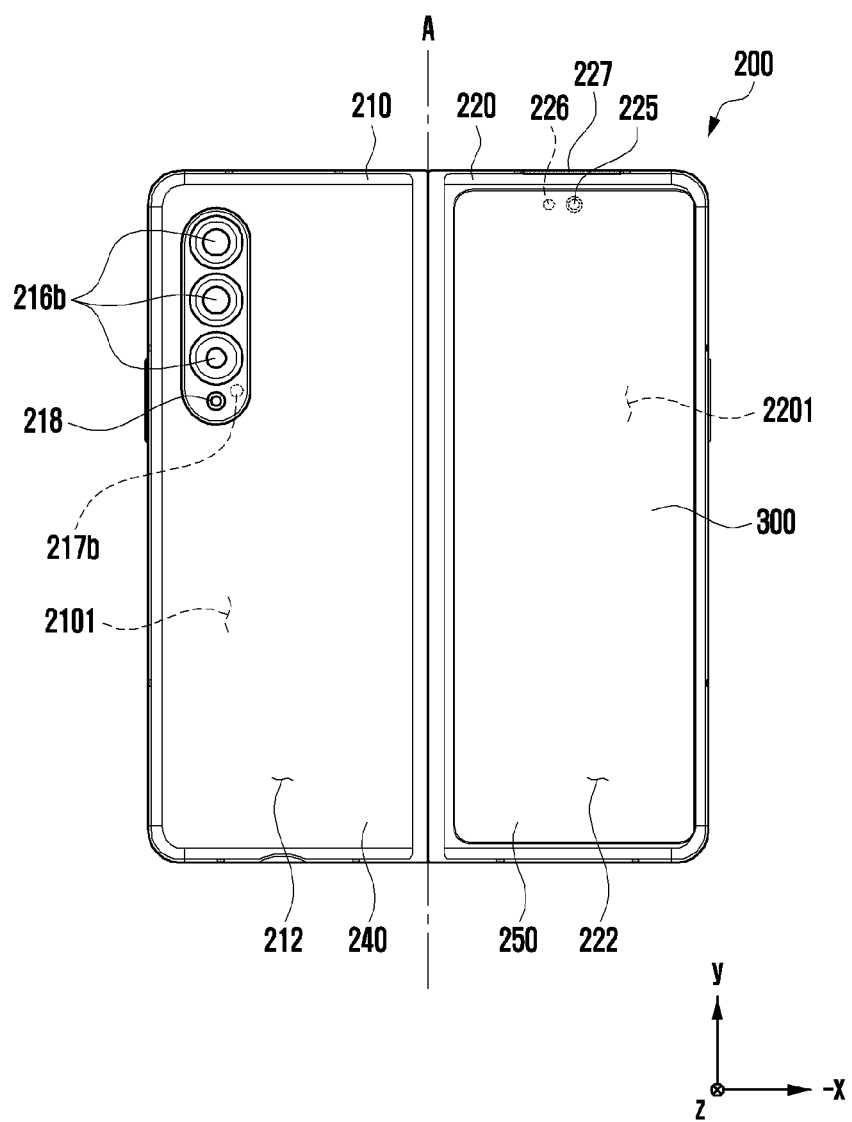
Figure 3A:
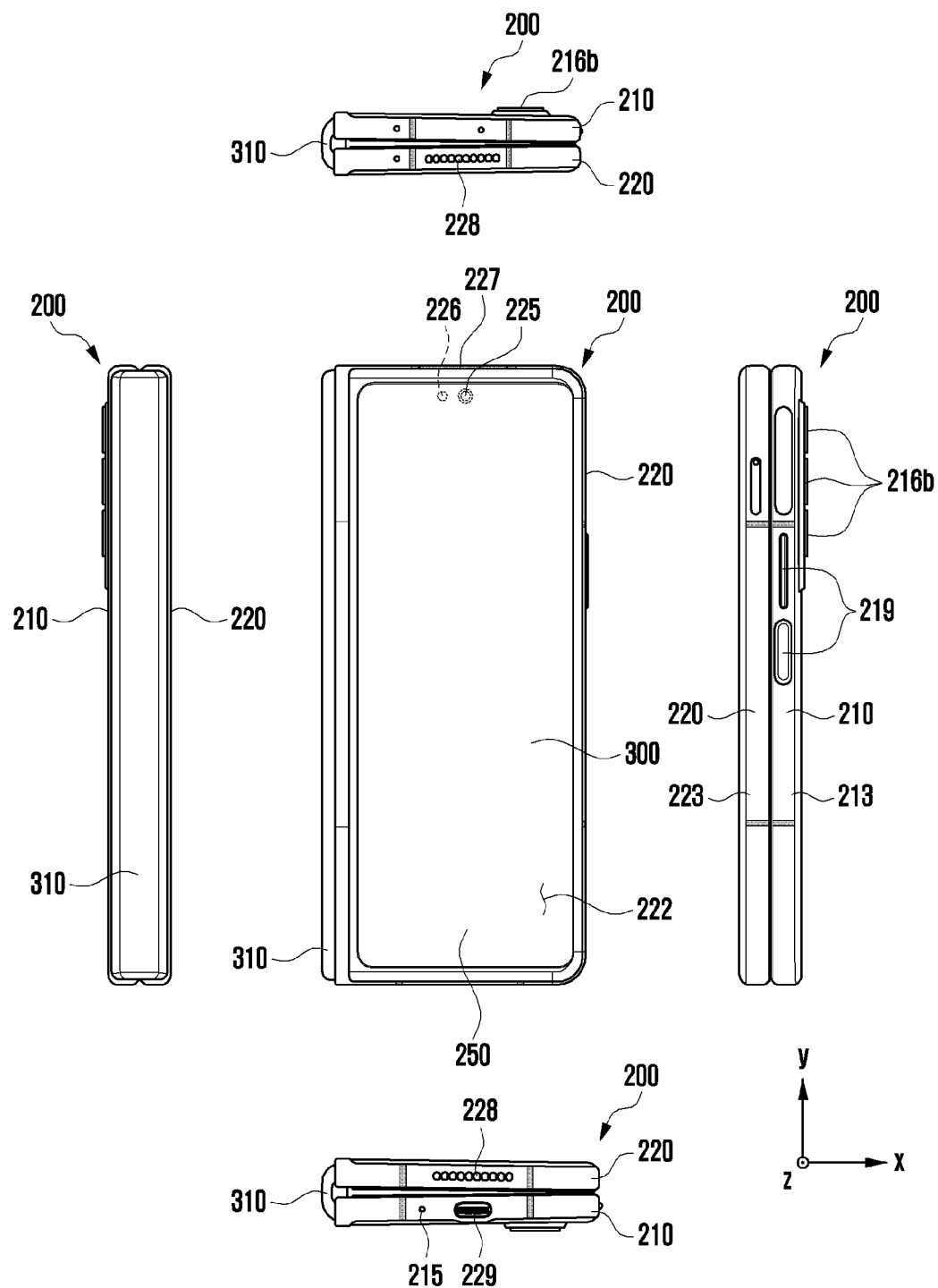
FIG. 3A and FIG. 3B are views of an electronic device in a folded state when viewed from the front and rear sides thereof according to various embodiments disclosed herein.
Figure 3B:
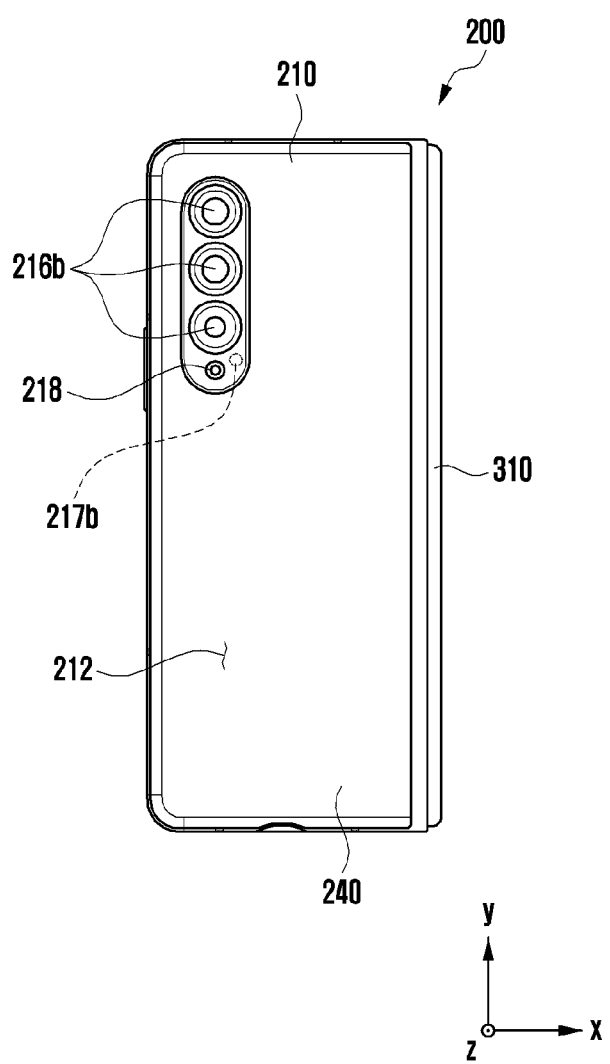

[1] FIGS. 2A and 2B illustrate a front view and a rear view of an unfolded state of an electronic device according to various embodiments of the disclosure. FIGS. 3A and 3B illustrate a front view and a rear view of a folded state of an electronic device according to various embodiments of the disclosure.

[2] Referring to FIGS. 2A to 3B, an electronic device 200 may include a pair of housings 210 and 220 (e.g., a foldable housing structure) rotatably coupled to each other with reference to folding axis A through a hinge device (e.g., a hinge device 320 of FIG. 4) (e.g., a hinge module) so as to be folded with respect to each other, a first display module 230 (e.g., a flexible display, a foldable display, or a main display) disposed through the pair of housings 210 and 220, and/or a second display module 300 (e.g., a sub display) disposed through the second housing 220. According to an embodiment, at least a part of the hinge device (e.g., the hinge device 320 of FIG. 4) may be disposed so as not to be seen from the outside through the first housing 210 and the second housing 220, and may be disposed so as not to be seen from the outside through the hinge housing 310 covering a foldable portion. According to an embodiment, the hinge device 320 may include a hinge module including a gear assembly including multiple gears and multiple hinge cams which are coupled to hinge shafts rotating through the gear assembly and perform a cam interlocking operation, and hinge plates for connecting the hinge model to the first housing 210 and the second housing 220. In the disclosure, a surface in which the first display module 230 is disposed may be defined as a front surface of the electronic device 200, and a surface opposite to the front surface may be defined as a rear surface of the electronic device 200. In addition, a surface surrounding a space between the front surface and the rear surface may be defined as a side surface of the electronic device 200.

Figure 4:
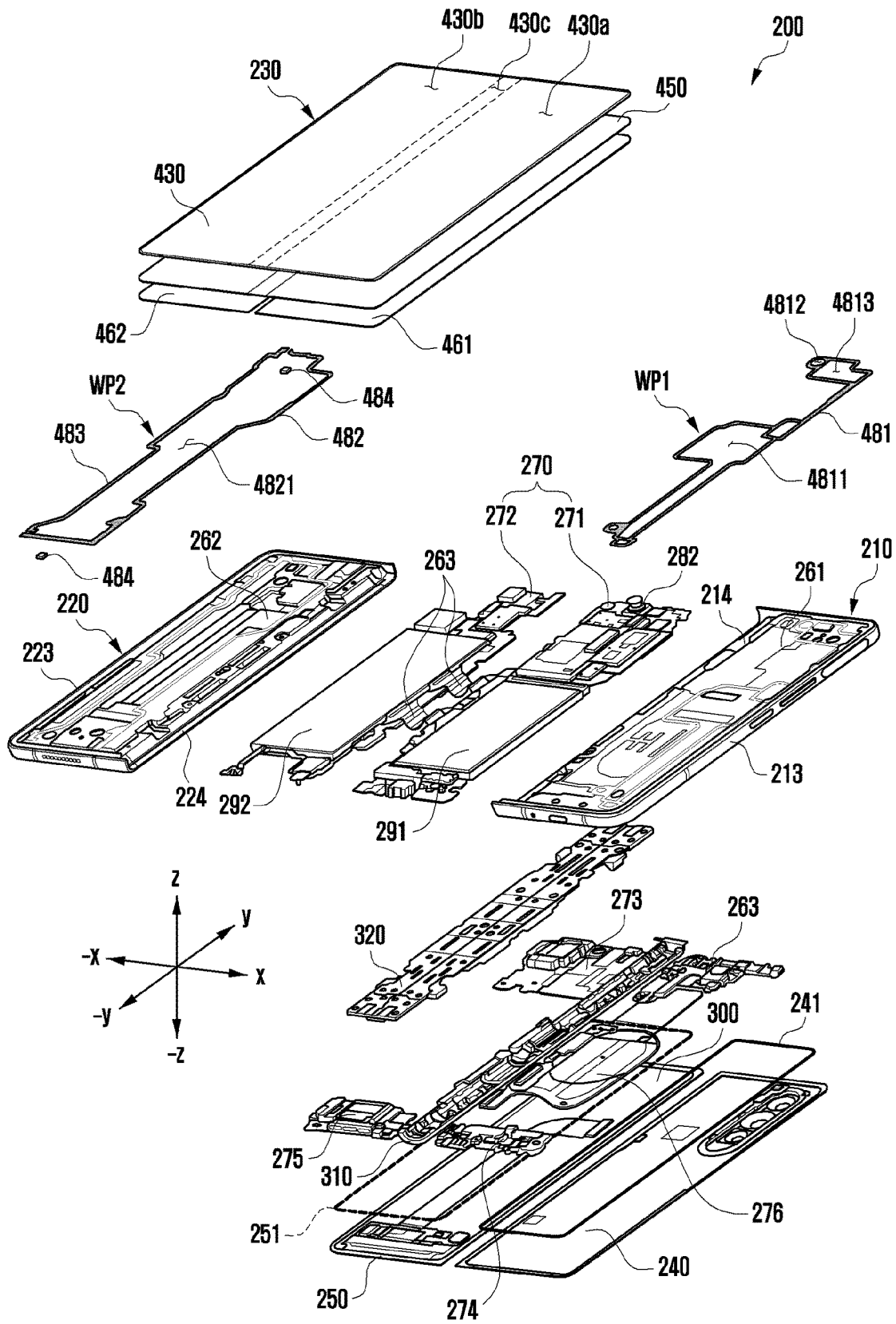
FIG. 4 is an exploded perspective view of an electronic device according to various embodiments disclosed herein.

[3] According to various embodiments, the pair of housings 210 and 220 may include a first housing 210 and a second housing 220 foldably arranged with respect to each other through the hinge device (e.g., the hinge device 320 of FIG. 4). According to an embodiment, the shape and the coupling of the pair of housings 210 and 220 are not limited to those illustrated in FIGS. 2A to 3B, and the pair of housings 210 and 220 may be implemented by a combination and/or coupling of other shapes or components. According to an embodiment, the first housing 210 and the second housing 220 may be arranged on opposite sides with reference to the folding axis A, and may have shapes that are entirely symmetric to each other with respect to the folding axis A. According to an embodiment, the first housing 210 and the second housing 220 may be asymmetrically folded with reference to the folding axis A. According to an embodiment, the angle or the distance between the first housing 210 and the second housing 220 may vary depending on whether the electronic device 200 is in an unfolded state, a folded state, or an intermediate state.

[4] According to various embodiments, the first housing 210 may include, in the unfolded state of the electronic device 200, a first surface 211 connected to the hinge device (e.g., the hinge device 320 of FIG. 4) and disposed to be oriented to the front surface of the electronic device 200, a second surface 212 oriented in a direction opposite to the first surface 211, and/or a first side member 213 surrounding at least a part of a first space between the first surface 211 and the second surface 212. According to an embodiment, the second housing 220 may include, in the unfolded state of the electronic device 200, a third surface 221 connected to the hinge device (e.g., the hinge device 320 of FIG. 4) and disposed to be oriented to the front surface of the electronic device 200, a fourth surface 222 oriented in a direction opposite to the third surface 221, and/or a second side member 223 surrounding at least a part of a second space between the third surface 221 and the fourth surface 222. According to an embodiment, the first surface 211 and the third surface 221 may be oriented in substantially the same direction in the unfolded state, and the first surface 211 and the third surface 221 may at least partially face each other in the folded state. According to an embodiment, the electronic device 200 may include a recess 201 formed to receive the first display module 230 through structural coupling of the first housing 210 and the second housing 220. According to an embodiment, the recess 201 may have substantially the same shape as the first display module 230. According to an embodiment, the first housing 210 may include a first protection frame 213a (e.g., a first decoration member) which is, when seen from above the first display module 230, coupled to the first side member 213, disposed to overlap with an edge of the first display module 230, so as to cover the edge of the first display module 230 to allow the same not to be seen from the outside. According to an embodiment, the first protection frame 213a may be integrally formed with the first side member 213. According to an embodiment, the second housing 220 may include a second protection frame 223a (e.g., a second decoration member) which is, when seen from above the first display module 230, coupled to the second side member 223, disposed to overlap with an edge of the first display module 230, so as to cover the edge of the first display module 230 to allow the same not to be seen from the outside. According to an embodiment, the second protection frame 223a may be integrally formed with the second side member 223. In an embodiment, the first protection frame 213a and the second protection frame 223a may be omitted.

[5] According to various embodiments, the hinge housing 310 (e.g., a hinge cover) may be disposed between the first housing 210 and the second housing 220, and may be disposed to cover a part (e.g., at least one hinge module) of the hinge device (e.g., the hinge device 320 of FIG. 4) disposed on the hinge housing 310. According to an embodiment, the hinge housing 310 may be hidden or exposed from or to the outside by a part of the first housing 210 and the second housing 220 according to the unfolded state, the folded state, or the intermediate state of the electronic device 200. For example, when the electronic device 200 is in the unfolded state, at least a part of the hinge housing 310 may be covered by the first housing 210 and the second housing 220 and not be substantially exposed. According to an embodiment, when the electronic device 200 is in the folded state, at least a part of the hinge housing 310 may be exposed to the outside between the first housing 210 and the second housing 220. According to an embodiment, in the intermediate state in which the first housing 210 and the second housing 220 are folded with each other by a predetermined angle (folded with a certain angle), the hinge housing 310 may be at least partially exposed to the outside of the electronic device 200 between the first housing 210 and the second housing 220. For example, an area in which the hinge housing 310 is exposed to the outside, may be smaller than that in a case in which the electronic device 200 is completely folded. According to an embodiment, the hinge housing 310 may include a curved surface.

[6] According to various embodiments, when the electronic device 200 is in the unfolded state (e.g., the states shown in FIGS. 2A and 2B), the first housing 210 and the second housing 220 may meet at an about 180-degree angle, and a first area 230a, a second area 230b, and a folding area 230c of the first display module 230 may form the same plane and arranged to be oriented in substantially the same direction (e.g., a z-axis direction). In another embodiment, when the electronic device 200 is in the unfolded state, the first housing 210 may rotate by an about 360-degree angle with respect to the second housing 220, and may be outwardly folded (an out-folding scheme) so that the second surface 212 and the fourth surface 222 face each other.

[7] According to various embodiments, when the electronic device 200 is in the folded state (e.g., the states shown in FIGS. 3A and 3B), the first surface 211 of the first housing 210 and the third surface 221 of the second housing 220 may be arranged to face each other. In this case, the first area 230a and the second area 230b of the first display module 230 may form a narrow angle (e.g., a range between 0 degree to about 10 degrees) through the folding area 230c, and may be arranged to face each other. According to an embodiment, at least a part of the folding area 230c may be deformed into a curved shape having a predetermined curvature. According to an embodiment, when the electronic device 200 is in the intermediate state, the first housing 210 and the second housing 220 may be arranged at a predetermined angle (a certain angle). In this case, the first area 230a and the second area 230b of the first display module 230 may form an angle that is greater than that in the folded state and smaller than that in the unfolded state, and the curvature of the folding area 230c may be lower than that in the folded state, and may be higher than that in the unfolded state. In an embodiment, the first housing 210 and the second housing 220 may form an angle which allows stopping at a designated folding angle between the folded state and the unfolded state (a free stop function), through the hinge device (e.g., the hinge device 320 of FIG. 4). In an embodiment, the first housing 210 and the second housing 220 may continuously operate while being pressed in an unfolding direction or a folding direction with reference to a designated inflection angle, through the hinge device (e.g., the hinge device 320 of FIG. 4).

[8] According to various embodiments, the electronic device 200 may include at least one of at least one display module 230 and 300 disposed on the first housing 210 and/or the second housing 220, an input device 215, sound output devices 227 and 228, sensor modules 217a, 217b, and 226, camera modules 216a, 216b, and 225, a key input device 219, an indicator (not shown), or a connector port 229. In an embodiment, the electronic device 200 may omit at least one of the elements, or may additionally include at least one another element.

[9] According to various embodiments, the at least one display module 230 and 300 may include a first display module 230 (e.g., a flexible display) disposed to be supported by the third surface 221 of the second housing 220 from the first surface 211 of the first housing 210 through the hinge device (e.g., the hinge device 320 of FIG. 4), and a second display module 300 disposed to be at least partially seen from the outside through the fourth surface 222 in a space in the second housing 220. In an embodiment, the second display module 300 may be disposed to be seen from the outside through the second surface 212 in a space in the first housing 210. According to an embodiment, the first display module 230 may be mainly used in the unfolded state of the electronic device 200, and the second display module 300 may be mainly used in the folded state of the electronic device 200. According to an embodiment, the electronic device 200 may control, in the intermediate state, the first display module 230 and/or the second display module 300 to be used, based on a folding angle between the first housing 210 and the second housing 220.

[10] According to various embodiments, the first display module 230 may be disposed in a receiving space formed by the pair of housings 210 and 220. For example, the first display module 230 may be disposed in a recess 201 formed by the pair of housings 210 and 220, and may be disposed to occupy substantially the most of the front surface of the electronic device 200 in the unfolded state. According to an embodiment, the first display module 230 may include a flexible display having at least one area which can be deformed into a plane or a curved surface. According to an embodiment, the first display module 230 may include the first area 230a facing the first housing 210 and the second area 230b facing the second housing 220. According to an embodiment, the first display module 230 may include the folding area 230c including a part of the first area 230a and a part of the second area 230b with respect to the folding axis A. According to an embodiment, at least a part of the folding area 230c may include an area corresponding to the hinge device (e.g., the hinge device 320 of FIG. 4). According to an embodiment, a division of an area of the first display module 230 merely corresponds to exemplary physical division by the pair of housings 210 and 220 and the hinge device (e.g., the hinge device 320 of FIG. 4), and the first display module 230 may be substantially displayed as one seamless full screen through the pair of the housings 210 and 220 and the hinge device (e.g., the hinge device 320 of FIG. 4). According to an embodiment, the first area 230a and the second area 230b may have shapes that are entirely symmetric or partially asymmetric to each other with respect to the folding area 230c.

[11] According to various embodiments, the electronic device 200 may include a first rear cover 240 disposed on the second surface 212 of the first housing 210 and a second rear cover 250 disposed on the fourth surface 222 of the second housing 220. In an embodiment, at least a part of the first rear cover 240 may be integrally formed with the first side member 213. In an embodiment, at least a part of the second rear cover 250 may be integrally formed with the second side member 223. According to an embodiment, at least one of the first rear cover 240 and the second rear cover 250 may be substantially formed of a transparent plate (e.g., a polymer plate or glass plate including various coding layers) or an opaque plate. According to an embodiment, the first rear cover 240 may be formed of, for example, an opaque plate such as coded or colored glass, ceramic, polymer, metal (e.g., aluminum, stainless steel (STS), or magnesium), or a combination of at least two of the materials above. According to an embodiment, the second rear cover 250 may be substantially formed of, for example, a transparent plate such as glass or polymer. Accordingly, the second display module 300 may be disposed to be seen from the outside through the second rear cover 250 in a space in the second housing 220.

[12] According to various embodiments, the input device 215 may include a microphone. In an embodiment, the input device 215 may include multiple microphones arranged to detect the direction of sound. According to an embodiment, the sound output devices 227 and 228 may include speakers. According to an embodiment, the sound output devices 227 and 228 may include a call receiver 227 disposed through the fourth surface 222 of the second housing 220 and an external speaker 228 disposed through at least a part of the second side member 223 of the second housing 220. In an embodiment, the input device 215, the sound output devices 227 and 228, and the connector port 229 may be disposed in spaces of the first housing 210 and/or the second housing 220, and may be exposed to an external environment through at least one hole formed through the first housing 210 and/or the second housing 220. In an embodiment, holes formed through the first housing 210 and/or the second housing 220 may be commonly used for the input device 215 and the sound output devices 227 and 228. In an embodiment, the sound output devices 227 and 228 may include a speaker (e.g., a piezo speaker) operating without including a hole formed through the first housing 210 and/or the second housing 220.

[13] According to various embodiments, the camera modules 216a, 216b, and 225 may include a first camera module 216a disposed on the first surface 211 of the first housing 210, a second camera module 216b disposed on the second surface 212 of the first housing 210, and/or a third camera module 225 disposed on the fourth surface 222 of the second housing 220. According to an embodiment, the electronic device 200 may include a flash 218 disposed around the second camera module 216b. According to an embodiment, the flash 218 may include, for example, a light-emitting diode or a xenon lamp. According to an embodiment, the camera modules 216a, 216b, and 225 may include one or multiple lenses, an image sensor, and/or an image signal processor. In an embodiment, at least one of the camera modules 216a, 216b, and 225 may include two or more lenses (e.g., wide-angle and telephoto lenses) and image sensors, and may be arranged together on one surface of the first housing 210 and/or the second housing 220.

[14] According to various embodiments, the sensor modules 217a, 217b, and 226 may generate a data value or an electrical signal corresponding to an internal operational state or an external environmental state of the electronic device 200. According to an embodiment, the sensor modules 217a, 217b, and 226 may include a first sensor module 217a disposed on the first surface 211 of the first housing 210, a second sensor module 217b disposed on the second surface 212 of the first housing 210, and/or a third sensor module 226 disposed on the fourth surface 222 of the second housing 220. In an embodiment, the sensor modules 217a, 217b, and 226 may include at least one of a gesture sensor, a grip sensor, a color sensor, an infrared (IR) sensor, an illuminance sensor, an ultrasonic sensor, an iris recognition sensor, or a distance detection sensor (e.g., a time of flight (TOF) sensor or a light detection and ranging (LiDAR)).

[15] According to various embodiments, the electronic device 200 may further include an unillustrated sensor module, for example, at least one of an atmospheric sensor, a magnetic sensor, a biometric sensor, a temperature sensor, a humidity sensor, or a fingerprint recognition sensor. In an embodiment, the fingerprint recognition sensor may be disposed through at least one of the first side member 213 of the first housing 210 and/or the second side member 223 of the second housing 220.

[16] According to various embodiments, the key input device 219 may be disposed to be exposed to the outside through the first side member 213 of the first housing 210. In an embodiment, the key input device 219 may be disposed to be exposed to the outside through the second side member 223 of the second housing 220. In an embodiment, the electronic device 200 may not include some or all of the key input device 219, and the unincluded key input device 219 may be implemented in another shape such as a soft key on the least one display module 230 and 300. In another embodiment, the key input device 219 may be implemented by using a pressure sensor included in the at least one display module 230 and 300.

[17] According to various embodiments, the connector port 229 may include a connector (e.g., a USB connector or an IF module (an interface connector port module)) for transmitting or receiving data and/or power to and/or from an external electronic device. In an embodiment, the connector port 229 may perform a function of transmitting or receiving an audio signal to or from the external electronic device together, or may further include a separate connector port (e.g., an ear jack hole) for performing a function of transmitting or receiving an audio signal to or from the external electronic device.

[18] According to various embodiments, at least one camera modules 216a and 225 of the camera modules 216a, 216b, and 225, at least one sensor module 217a and 226 of the sensor modules 217a, 217b, and 226, and/or an indicator may be arranged to be exposed through the at least one display module 230 and 300. For example, the at least one camera modules 216a and 225, the at least one sensor module 217a and 226, and/or the indicator may be arranged under an activated area (a display area) of the at least one display module 230 and 300 in a space in the at least one housing 210 and 220, and may be arranged to come into contact with an external environment through a transparent area or an opening that is perforated to a cover member (e.g., a window layer (not shown) of the first display module 230 and/or the second rear cover 250). According to an embodiment, an area in which the at least one display module 230 and 300 and the at least one camera module 216a and 225 face each other may be formed as a transmission area having a predetermined transmission ratio, as a part of an area in which a content is displayed. According to an embodiment, the transmission area may be formed to have a transmission ratio in the range of about 5% to about 20%. The transmission area may include an area overlapping with an effective area (e.g., an angle of view area) of the at least one camera module 216a and 225, where an image is formed on the image sensor in the effective area, and light for generating an image passes through the effective area. For example, the transmission area of the display module 230 and 300 may include an area in which the density of a pixel is lower than that in a surrounding area. For example, the transmission area may be replaced with an opening. For example, the at least one camera module 216a and 225 may include an under-display camera (UDC) or an under-panel camera (UPC). In another embodiment, some camera modules or sensor modules 271a and 226 may be arranged to perform functions thereof without being visually exposed through the display. For example, an area facing the sensor module 217a and 226 and/or the camera module 216a and 225 arranged under the display module 230 and 300 (e.g., a display panel) corresponds to an under-display camera (UDC) structure, and a perforated opening is not necessarily required.

[19] FIG. 4 is an exploded perspective view illustrating an electronic device 200 according to various embodiments of the disclosure.

[20] Referring to FIG. 4, the electronic device 200 may include a first display module 230 (e.g., a flexible display), a second display module 300, a hinge device 320, a pair of support members 261 and 262, at least one substrate 270 (e.g., a printed circuit board (PCB)), a first housing 210, a second housing 220, a first rear cover 240, and/or a second rear cover 250.

[21] According to various embodiments, the first display module 230 may include a display panel 430 (e.g., a flexible display panel), a support plate 450 disposed under the display panel 430, and a pair of reinforcement plates 461 and 462 arranged under the support plate 450. According to an embodiment, the display panel 430 may include a first panel area 430a corresponding to a first area (e.g., the first area 230a of FIG. 2A) of the first display module 230, a second panel area 430b extending from the first panel area 430a and corresponding to a second area (e.g., the second area 230b of FIG. 2A) of the first display module 230, and a third panel area 430c for connecting the first panel area 430a and the second panel area 430b and corresponding to a folding area (e.g., the folding area 230c of FIG. 2A) of the first display module 230. According to an embodiment, the support plate 450 may be disposed between the display panel 430 and the pair of support members 261 and 262 and may be formed to have a material and a shape for providing a planar support structure for the first panel area 430a and the second panel area 430b and a bendable structure for assisting in the flexibility of the third panel area 430c. According to an embodiment, the support plate 450 may be formed of a conductive material (e.g., metal) or a non-conductive material (e.g., polymer or fiber reinforced plastic (FRP)). According to an embodiment, the pair of reinforcement plates 461 and 462 may include, between the support plate 450 and the pair of support members 261 and 262, a first reinforcement plate 461 disposed to correspond to at least a part of the first panel area 430a and the third panel area 430c, and a second reinforcement plate 462 disposed to correspond to at least a part of the second panel area 460b and the third panel area 430c. According to an embodiment, the pair of reinforcement plates 461 and 462 may be formed of metal materials (e.g., SUS), and may thus assist in reinforcing of the rigidity and a ground connection structure for the first display module 230.

[22] According to various embodiments, the second display module 300 may be disposed in a space between the second housing 220 and the second rear cover 250. According to an embodiment, the second display module 300 may be disposed in a space between the second housing 220 and the second rear cover 250 so as to allow the second display module 300 to be seen from the outside through substantially the entire area of the second rear cover 250.

[23] According to various embodiments, at least a part of the first support member 261 may be bendably coupled to the second support member 262 through the hinge device 320. According to an embodiment, the electronic device 200 may include at least one wire member 263 (e.g., a flexible printed circuit board (FPCB)) disposed from at least a part of the first support member 261 to a part of the second support member 262 by crossing the hinge device 320. According to an embodiment, the first support member 261 may be disposed by extending from the first side member 213 or structurally coupled to the first side member 213. According to an embodiment, the electronic device 200 may include a first space (e.g., a first space 2101 of FIG. 2A) provided through the first support member 261 and the first rear cover 240. According to an embodiment, the first housing 210 (e.g., a first housing structure) may be configured by coupling of the first side member 213, the first support member 261, and the first rear cover 240. According to an embodiment, the second support member 262 may be disposed by extending from the second side member 223 or structurally coupled to the second side member 223. According to an embodiment, the electronic device 200 may include a second space (e.g., a second space 2201 of FIG. 2A) provided through the second support member 262 and the second rear cover 250. According to an embodiment, the second housing 220 (e.g., a second housing structure) may be configured through coupling of the second side member 223, the second support member 262, and the second rear cover 250. According to an embodiment, at least a part of the hinge device 320 and/or the at least one wire member 263 may be disposed to be supported through at least a part of the pair of support members 261 and 262. According to an embodiment, the at least one wire member 263 may be disposed in a direction (e.g., an x-axis direction) crossing the first support member 261 and the second support member 262. According to an embodiment, the at least one wire member 263 may be disposed in a direction (e.g., an x-axis direction) substantially perpendicular to a folding axis (e.g., a y-axis or the folding axis A of FIG. 2A).

[24] According to various embodiments, the at least one substrate 270 may include a first substrate 271 disposed in the first space 2101 and a second substrate 272 disposed in the second space 2201. According to an embodiment, the first substrate 271 and the second substrate 272 may include multiple electronic components arranged to implement various functions of the electronic device 200. According to an embodiment, the first substrate 271 and the second substrate 272 may be electrically connected to each other through the at least one wire member 263.

[25] According to various embodiments, the electronic device 200 may include at least one battery 291 and 292. According to an embodiment, the at least one battery 291 and 292 may include a first battery 291 disposed in the first space 2101 of the first housing 210 and electrically connected to the first substrate 271, and a second battery disposed in the second space 2201 of the second housing 220 and electrically connected to the second substrate 272. According to an embodiment, the first support member 261 and the second support member 262 may further include at least one swelling hole for the first battery 291 and the second battery 292.

[26] According to various embodiments, the first housing 210 may include a first rotation support surface 214, and the second housing 220 may include a second rotation support surface 224 corresponding to the first rotation support surface 214. According to an embodiment, the first rotation support surface 214 and the second rotation support surface 224 may include a curved surface (seamlessly connected) corresponding to an external surface of a curved shape of the hinge housing 310. According to an embodiment, when the electronic device 200 is in the unfolded state, the first rotation support surface 214 and the second rotation support surface 224 may hide the hinge housing 310 not to expose the hinge housing 310 through the rear surface of the electronic device 200 or to expose only a part thereof. According to an embodiment, when the electronic device 200 in the folded state, the first rotation support surface 214 and the second rotation support surface 224 may be at least partially expose the hinge housing 310 through the rear surface of the electronic device 200 as the curved shape of the hinge housing 310 rotates along an external surface.

[27] According to various embodiments, the electronic device 200 may include at least one antenna 276 disposed in the first space 2101. According to an embodiment, the at least one antenna 276 may be disposed on the first battery 291 and the first rear cover 240 in the first space 2101. According to an embodiment, the at least one antenna 276 may include, for example, a near-field communication (NFC) antenna, a wireless charging antenna, and/or a magnetic secure transmission (MST) antenna. According to an embodiment, the at least one antenna 276 may perform, for example, short-distance communication with an external device, or wirelessly transmit or receive power required for charging. In an embodiment, an antenna structure may be formed by at least a part of the first side member 213 or the second side member 223 and/or a part or a combination of the first support member 261 and the second support member 262.

[28] According to various embodiments, the electronic device 200 may further include at least one electronic component assembly 274 and 275 and/or additional support members 263 and 273 disposed in the first space 2101 and/or the second space 2201. For example, the at least one electronic component assembly may include an interface connector port assembly 274 or the speaker assembly 275.

[29] According to various embodiments, the electronic device 100 may include a first waterproof structure WP1 disposed between the first reinforcement plate 461 and the first support member 261 and a second waterproof structure WP2 disposed between the second reinforcement plate 462 and the second support member 262. According to an embodiment, the first waterproof structure WP1 may include a first waterproof member 481 disposed to have at least one first waterproof space 4811, 4812, and 4813 formed between the first reinforcement plate 461 and the first support member 261. According to an embodiment, the second waterproof structure WP2 may include a second waterproof member 482, a third waterproof member 483, and a fourth waterproof member 484 disposed to have at least one second waterproof space 4821 formed between the second reinforcement plate 462 and the second support member 262. According to an embodiment, the fourth waterproof member 484 may be disposed in a space between the second waterproof member 482 and the third waterproof member 483 spaced apart from each other, to connect the second waterproof member and the third waterproof member to each other.

[30] According to various embodiments, the electronic device 200 may include waterproof tape 241 disposed between the first rear cover 240 and the first housing 210. According to an embodiment, the electronic device 200 may include a bonding member 251 disposed between the second rear cover 250 and the second housing 220. In an embodiment, the bonding member 251 may be disposed between the second display module 300 and the second housing 220. In an embodiment, the waterproof tape 241 may be replaced with the bonding member 251, and the bonding member 251 may be replaced with the waterproof tape 241.

[31] In the electronic device 200 according to an exemplary embodiment of the disclosure, the at least one waterproof member 481, 482, 483, and 484 may include at least one waterproof structure WP1 and WP2 disposed between the first support member 261 of the first housing 210 and the first reinforcement plate 461 and/or between the second support member 262 of the second housing 220 and the second reinforcement plate 462, so that a phenomenon in which the first display is damaged when the first display module 230 is separated from the housings 210 and 220 for maintenance of the electronic device 200 can be reduced through a waterproof member, and the at least one waterproof member 481, 482, 483, and 484 is disposed to avoid the rear surface of the first display module 230, and thus, external visibility can be enhanced and a surface quality can be secured.

Figure 5:
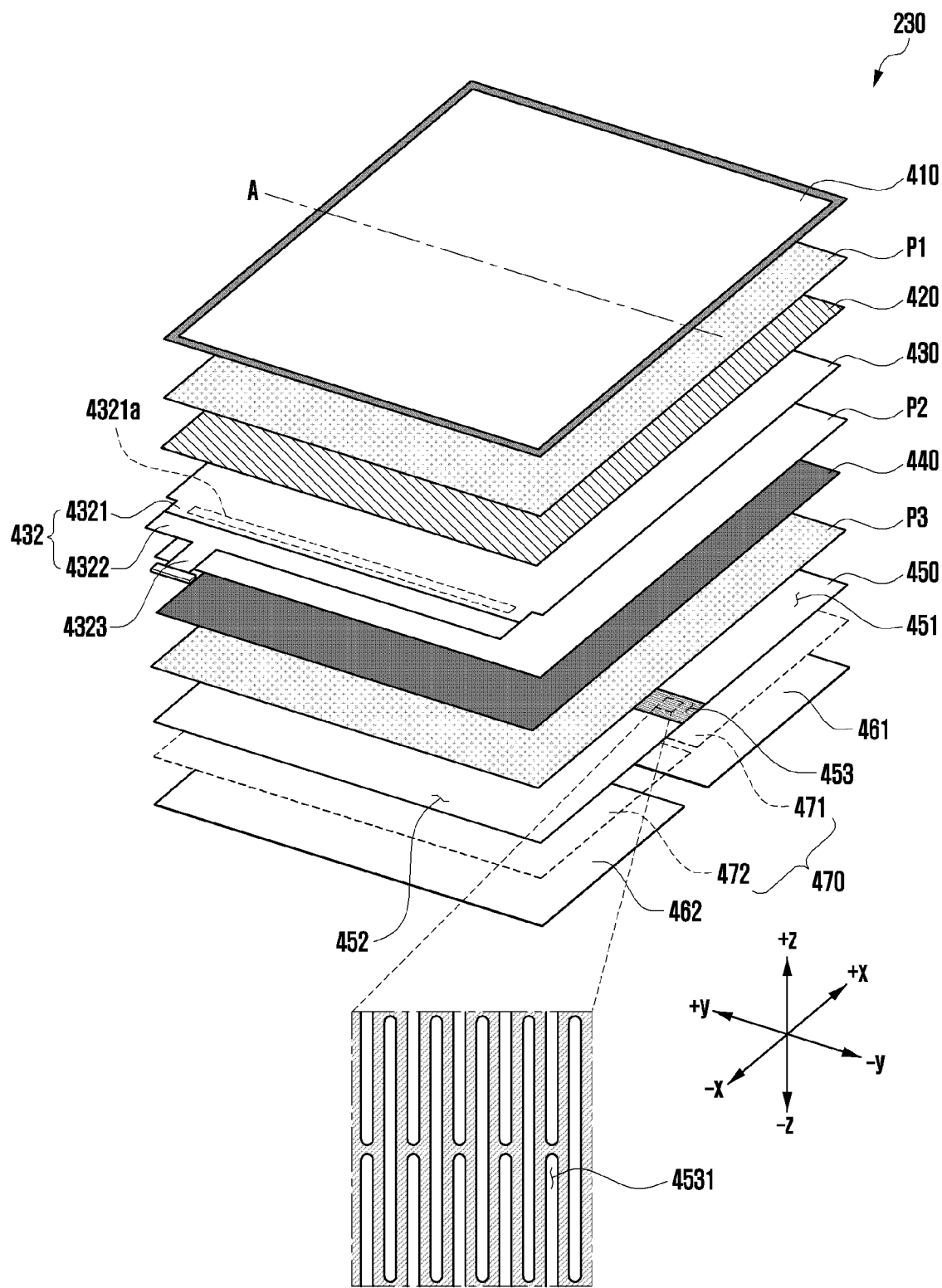
FIG. 5 is an exploded perspective view of a display module 230 according to various embodiments disclosed herein.

FIG. 5 is an exploded perspective view of a display module 230 according to various embodiments disclosed herein. The display module in FIG. 5 may be an example of the first display (e.g., the first display module 230 in FIG. 2A and FIG. 4) illustrated in FIG. 2A and FIG. 4.

A flexible display module 230 according to exemplary embodiments of the disclosure may include an unbreakable (UB) type OLED display (e.g., a curved display). However, the flexible display module 230 is not limited thereto and may include a flat type display of an on-cell touch active-matrix organic light-emitting diode (AMOLED) (OCTA) type Referring to FIG. 5, the flexible display module 230 may include a window layer 410, and a polarizer (POL) 420 (e.g., a polarizing film), a display panel 430, a polymer layer 440, a support plate 450, and a reinforcement plates 461 and 462, which are sequentially disposed on the rear surface (e.g., the −z-axis direction) of the window layer 410. In one embodiment, the flexible display module 230 may include a digitizer panel 470 disposed between the support plate 450 and the reinforcement plates 461 and 462. In one embodiment, the digitizer panel 470 may be disposed between the polymer layer 440 and the support plate 450.

According to various embodiments, the window layer 410 may include a glass layer. According to an embodiment, the window layer 410 may include ultra-thin glass (UTG). In one embodiment, the window layer 410 may include polymer. In this case, the window layer 410 may include polyethylene terephthalate (PET) or polyimide (PI). In one embodiment, the window layer 410 may be disposed as multiple layers so as to include a glass layer and polymer.

According to various embodiments, the window layer 410, the polarizer 420, the display panel 430, the polymer layer 440, and the support plate 450 may be disposed across at least a part of a first surface (e.g., the first surface 211 in FIG. 2A) of a first housing (e.g., the first housing 210 in FIG. 2A) and a third surface (e.g., the third surface 221 in FIG. 2A) of a second housing (e.g., the second housing 220 in FIG. 2A). According to an embodiment, the reinforcement plates 461 and 462 may include a first reinforcement plate 461 corresponding to the first housing (e.g., the first housing 210 in FIG. 2A) and a second reinforcement plate 462 corresponding to a second housing (e.g., the second housing 220 in FIG. 2A). According to an embodiment, the reinforcement plates 461 and 462 may provide the rigidity for the flexible display module 230 and may be used as a ground for preventing malfunction of the flexible display module 230. According to an embodiment, the reinforcement plates 461 and 462 may be made of a metal material. According to an embodiment, the reinforcement plates 461 and 462 may be made of SUS or AL. According to an embodiment, the window layer 410, the polarizer 420, the display panel 430, the polymer layer 440, the support plate 450, and reinforcement plates 461 and 462 may be attached to each other via sticking agents P1, P2, and P3 (or adhesives). For example, the sticking agents P1, P2, and P3 may include at least one of an optical clear adhesive (OCA), a pressure sensitive adhesive (PSA), a heat-reactive adhesive, a general adhesive, or a double-sided tape.

According to various embodiments, the display panel 430 may include a plurality of pixels and a wiring structure (e.g., an electrode pattern). According to an embodiment, the polarizer 420 may selectively pass light generated from a light source of the display panel 430 and vibrating in a predetermined direction. According to an embodiment, the display panel 430 and the polarizer 420 may be integrally configured. According to an embodiment, the flexible display module 230 may include a touch panel (not illustrated).

According to various embodiments, the polymer layer 440 may be disposed under the display panel 430 to provide a dark background for securing visibility of the display panel 430, and may be made of a buffer material for a buffering action. In one embodiment, for waterproofing of the flexible display module 230, the polymer layer 440 may be removed or disposed under the support plate 450.

According to various embodiments, the support plate 450 may provide flexural characteristics to the flexible display module 230. For example, the support plate 450 may be made of a non-metal sheet material such as fiber reinforced plastics (FRP) (e.g., carbon fiber reinforced plastics (CFRP) or glass fiber reinforced plastics (GFRP)) having rigid properties for supporting the display panel 430. According to an embodiment, the support plate 450 may include a first flat portion 451 corresponding to the first housing (e.g., the first housing 210 in FIG. 2A), a second flat portion 452 corresponding to the second housing (e.g., the second housing 220 of FIG. 2A), and a bending portion 453 (a flexible portion or bending portion) connecting the first flat portion 451 and the second flat portion 452. According to an embodiment, the bending portion 453 may include a plurality of openings 4531 arranged at a predetermined interval. According to an embodiment, the bending characteristics of the bending portion 453 may be determined through at least one of a size, a shape, or an arrangement density of at least a part of the plurality of openings 4531. According to one embodiment, the support plate 450 may be made of steel use stainless (SUS) (e.g., stainless steel (STS)), Cu, Al, or a metal CLAD (e.g., a laminated member in which SUS and Al are alternately disposed). In this case, the support plate 450 may have a plurality of openings over the entire surface so that the detection operation of the digitizer panel 470 arranged thereunder is guided. According to an embodiment, the support plate 450 may contribute to reinforcement of the rigidity of an electronic device (e.g., the electronic device 200 of FIG. 2A), and may be used to shield ambient noise and dissipate heat emitted from a surrounding heat emission component.

According to various embodiments, the display module 230 (e.g., the first display module 230 in FIG. 2A) may include the digitizer panel 470 as a detection member which is disposed under the support plate 450 and receives an input of an electronic pen (e.g., a stylus). According to an embodiment, the digitizer panel 470 may include coil members disposed on a dielectric substrate (e.g., a dielectric film or a dielectric sheet) so as to detect a resonance frequency of an electromagnetic induction scheme applied from the electronic pen. According to an embodiment, the digitizer panel 470 may include a first digitizer panel 471 corresponding to the first housing (e.g., the first housing 210 in FIG. 2A) and a second digitizer panel 472 corresponding to the second housing (e.g., the second housing 220 in FIG. 2A). According to an embodiment, the first digitizer panel 471 and the second digitizer panel 472 are electrically connected to the substrates (e.g., the substrates 271 and 272 in FIG. 4) of the electronic device (e.g., the electronic device 200 in FIG. 4) via FPCB connectors (e.g., the first FPCB connector 4711 and the second FPCB connector 4721 in FIG. 6), respectively, so as to operate as one digitizer panel. According to one embodiment, the first digitizer panel 471 and the second digitizer panel 472 may be individually operated.

According to various embodiments, the flexible display module 230 may include at least one functional member (not illustrated) disposed between the polymer layer 440 and the support plate 450 or disposed under the support plate 450. According to an embodiment, the functional member may include a graphite sheet for heat dissipation, an added display, a force touch FPCB, a fingerprint sensor FPCB, an antenna radiator for communication, or a conductive/non-conductive tape. According to an embodiment, when bending is impossible, the functional member may be individually disposed in the first housing (e.g., the first housing 210 of FIG. 2A) and the second housing (e.g., the second housing 220 of FIG. 2A). According to an embodiment, when bending is possible, the functional member may be disposed from the first housing (e.g., the first housing 210 of FIG. 2A) to at least a part of the second housing (e.g., the second housing 220 of FIG. 2A) via a hinge device (e.g., the hinge device 320 of FIG. 4).

According to various embodiments, the flexible display module 230 may include a bending portion 432 disposed in a manner to be folded from the display panel 430 toward at least a partial region of the rear surface (e.g., the −z-axis direction) of the flexible display module 230. According to an embodiment, the bending portion 432 may include an extension part 4321, which extends from the display panel 430 and includes a control circuit 4321a, and a flexible substrate 4322, which is electrically connected to the extension part 4321 and includes multiple electrical elements. According to an embodiment, the control circuit 4321a may include a display driver IC (DDI) or a touch display driver IC (TDDI), mounted to the extension part 4321 having an electrical wiring structure. According to an embodiment, the bending portion 432 may include a chip-on panel or chip-on plastic (COP) structure in which the control circuit 4321a is directly disposed in the extension part 4321. In one embodiment, the bending portion 432 may include a chip-on film (COF) structure in which the control circuit 4321a is mounted to a separate connection film (not illustrated) for connecting the extension part 4321 to the flexible substrate 4322. According to an embodiment, the flexible display module 230 a FPCB connector 4323 which extends from the flexible substrate 4322 and is electrically connected to a substrate (e.g., the second substrate 272 in FIG. 4) of an electronic device (e.g., the electronic device 200 in FIG. 4). According to an embodiment, the multiple electrical elements may include a touch IC 631, a display flash memory, an ESD prevention diode, a pressure sensor, a fingerprint sensor, or a passive element such as a decap. In another embodiment, when the bending portion 432 is disposed in a region of the flexible display module 230, facing the first housing (e.g., the first housing 210 in FIG. 2A), the FPCB connector 4323 may be electrically connected to another substrate (e.g., the first substrate 271 in FIG. 4) of the electronic device (e.g., the electronic device 200 in FIG. 4).

Figure 6A:
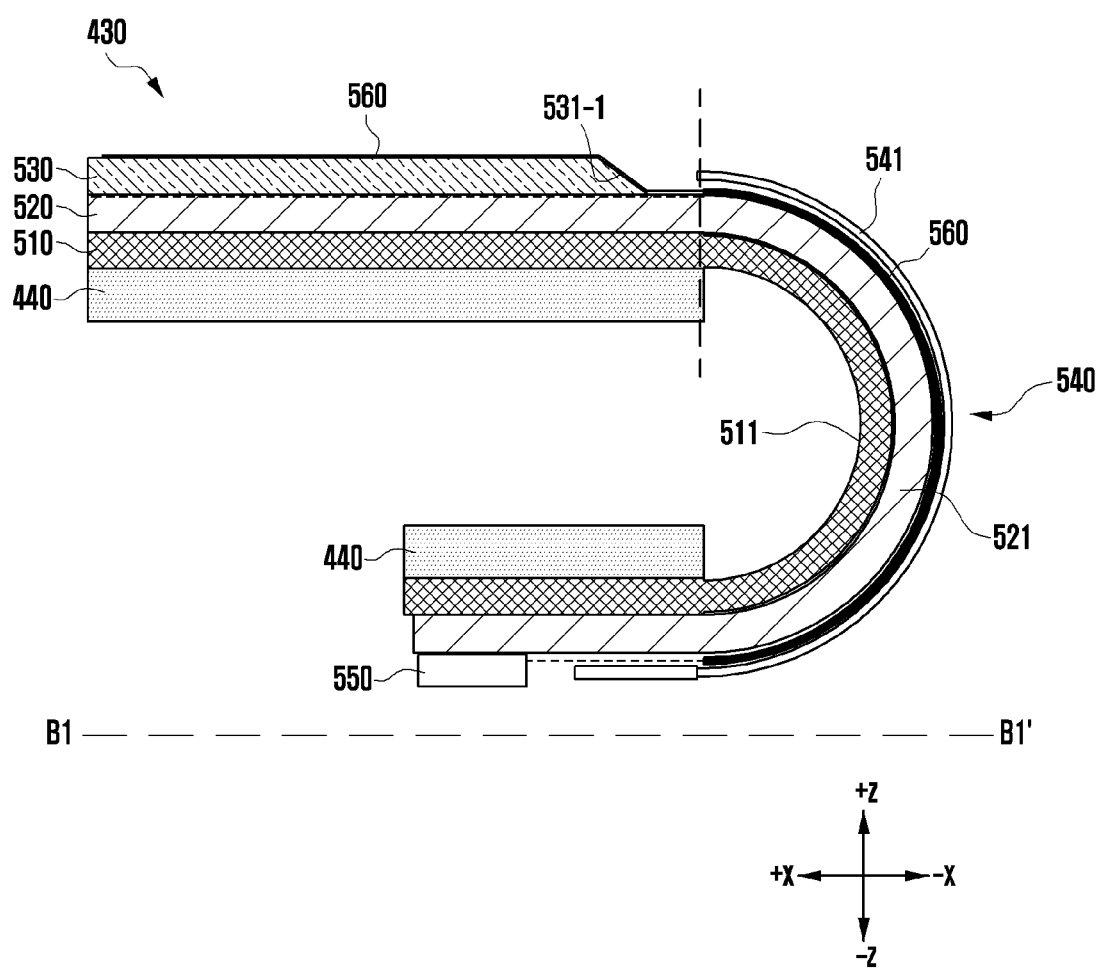
FIG. 6A is a cross-sectional view of a display panel in a state of being taken along line B1-B1' in FIG. 7A.
Figure 6B:
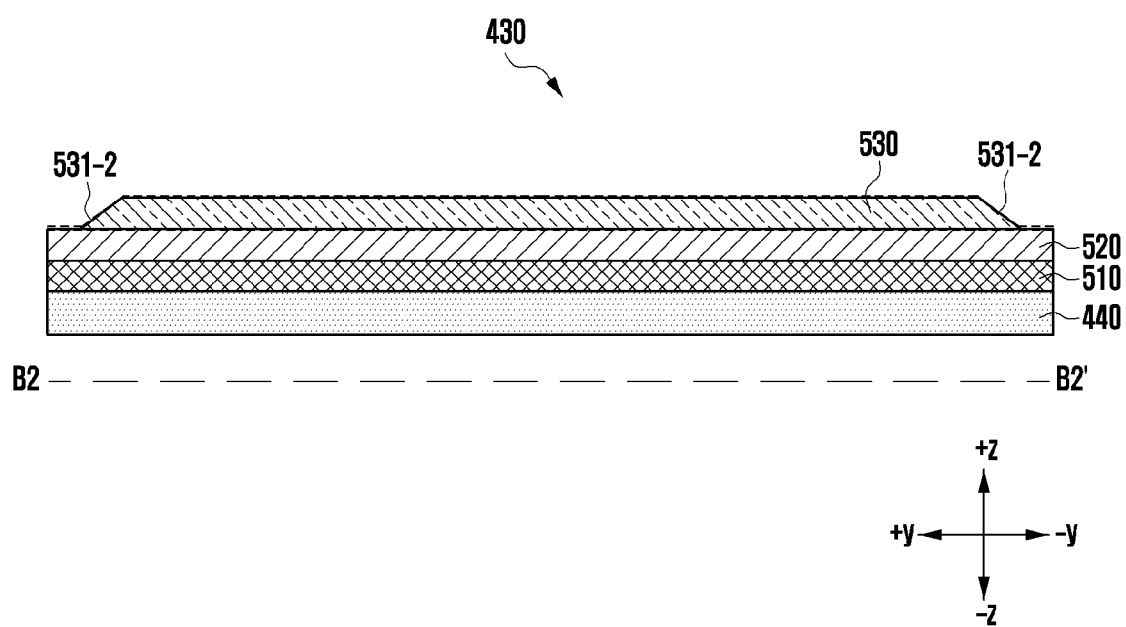
FIG. 6B is a cross-sectional view of a display panel in a state of being taken along line B2-B2' in FIG. 7A.
Figure 7A:
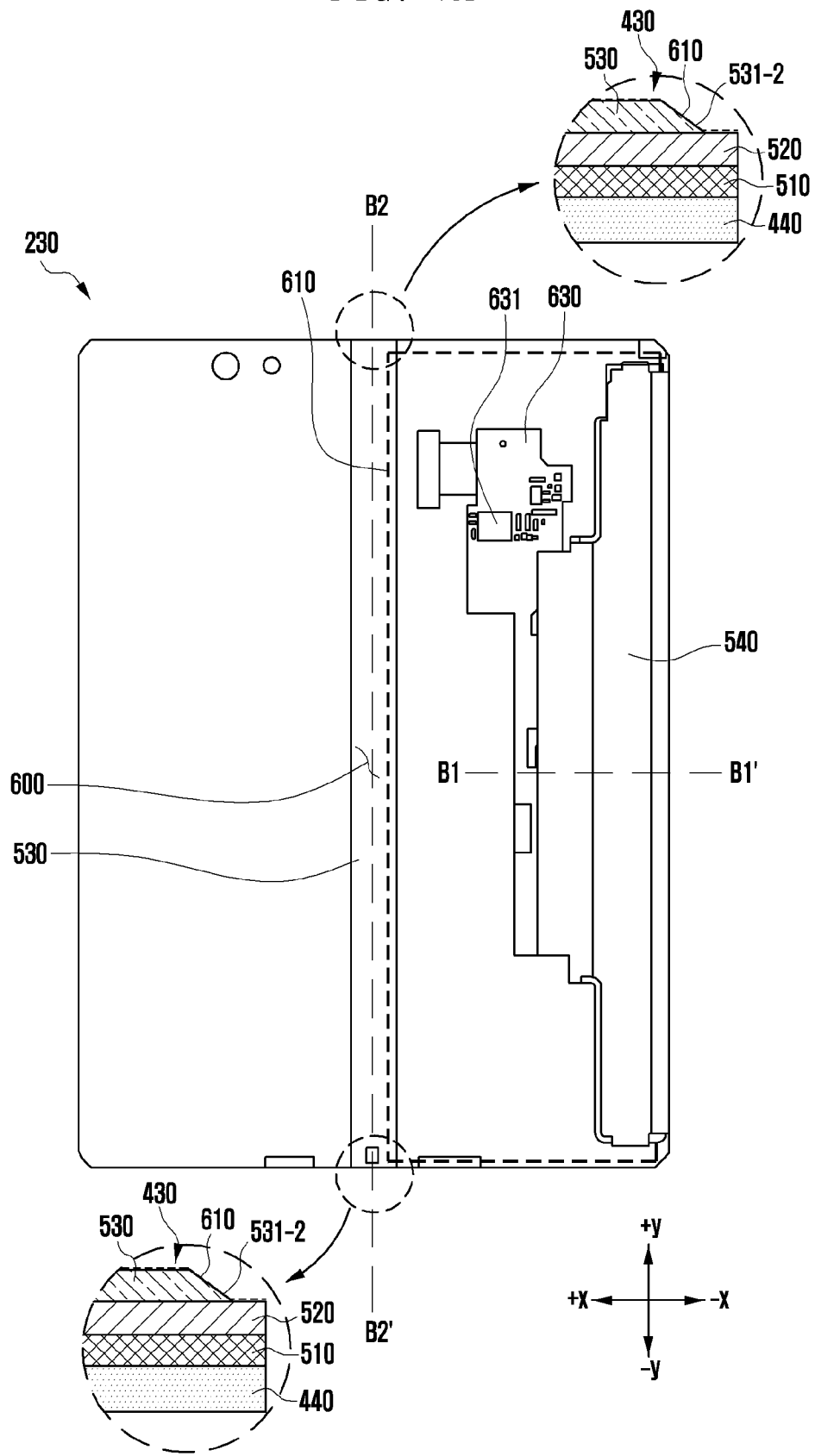
FIG. 7A to FIG. 7E are views illustrating an arrangement state of a detection wire included in a display panel according to various embodiments disclosed herein.

FIG. 6A is a cross-sectional view of a display panel 430 in a state of being taken along line B1-B1' in FIG. 7A. FIG. 6B is a cross-sectional view of a display panel 430 in a state of being taken along line B2-B2' in FIG. 7A. FIG. 7A to FIG. 7D are views illustrating an arrangement state of a detection wire 610 included in a display panel 430 according to various embodiments disclosed herein.

According to various embodiments, the display panel 430 constituting the display module 230 (e.g., the display module 160 in FIG. 1 or the first display module 230 in FIG. 2A) may include a flexible substrate 510, a plurality of light-emitting elements (e.g., an oxide light-emitting diode (OLED) or a light-emitting diode (LED)) arranged on the flexible substrate 510, a thin film transistor (TFT) layer 520 electrically connected to the light-emitting elements, and/or a protection layer 530 configured to protect the TFT layer 520. In an embodiment, referring to FIG. 6A and FIG. 6B, the display panel 430 may have a structure where the flexible substrate 510, the TFT layer 520, and the protection layer 530 are laminated in this order. In an embodiment, the flexible substrate 510 may be made of a flexible material so as to move in response to various deformations of the display module 230. For example, the flexible substrate 510 of the display panel 430 may be made of a flexible material such as polyimide (PI) or polyethylene terephthalate (PET), or may be made of glass processed to have a very thin thickness.

According to an embodiment, the TFT layer 520 may be laminated on the flexible substrate 510. The TFT layer 520 may be electrically connected to a display driver IC 550 via a plurality of patterned wires. The TFT layer 520 may be electrically connected to the display driver IC 550 so as to adjust the brightness of a pixel including the light-emitting element via the signal transmitted from the display driver IC 550. The TFT layer 520 may have an active layer through which the current can flow. The TFT layer 520 may adjust the gate voltage to move electrons from the source to the drain via the active layer. As the current is applied to the TFT layer 520, the light-emitting element constituting the pixel can emit light. In an embodiment, the TFT layer 520 may be made of a material in which electrons move smoothly. For example, the TFT layer 520 may be made of a material such as low-temperature polycrystalline silicon (LTPS).

According to an embodiment, the protection layer 530 configured to protect the TFT layer 520 may be laminated on the TFT layer 520. The protection layer 530 may be a thin film encapsulation (TFE) laminated on the TFT layer 520 to protect the TFT layer 520 constituting the display panel 430 from moisture and air. The protection layer 530 may be laminated on the TFT layer by applying the material constituting the protection layer 530 to the TFT layer 520.

According to various embodiments, the display module 230 may include a touch panel. In an embodiment, the touch panel may be disposed between the window layer 410 and the display panel 430. In an embodiment, the touch panel may be configured in an on-cell touch AMOLED (OCTA) type. For example, a touch wire 560 of the touch panel may be patterned on the protection layer 530 laminated on the TFT layer 520 to be integrally configured with the protection layer 530 so as to be connected to the touch circuit (not illustrated) of the electronic device 200. In this case, as the touch panel is not disposed separately on the display module 230, the thickness of the display module 230 may be reduced.

According to various embodiments, a display driver IC (DDI) 550 configured to control the drive of the display panel 430 may be arranged on the same substrate (e.g., the TFT layer 520) as the substrate on which the light-emitting element is arranged in the display panel 430. For example, as will be described later, the display driver IC 550 may be electrically connected to a second layer 521 of a bending portion 540 (e.g., the bending portion 432 in FIG. 5) connected to the TFT layer 520 of the display panel 430 so as to be electrically connected to a flexible substrate 630 disposed on the rear surface of the display module 230. In one embodiment, the display driver IC 550 may be arranged on a substrate different from the substrate on which the light-emitting element is arranged to be electrically connected to the substrate on which the light-emitting element is arranged.

According to various embodiments, the display module 230 may include a bending portion 540 which is at least partially bent from the display panel 430 to extend to the rear surface (e.g., the surface facing the −Z direction in FIG. 6A) of the display module 230. The bending portion 540 may extend to the side surface of the display panel 430. For example, the bending portion 540 may extend in a first direction (e.g., the −X direction in FIG. 6A) perpendicular to the folding axis A of the display module 230 and extend to the rear surface of the display module 230. The bending portion 540 may include a display driver IC (DDI) 550. For example, the display driver IC 550 may be arranged on the rear surface (e.g., the surface facing the −Z direction in FIG. 6A) of the bending portion 540. The display panel 430 may include a chip-on panel (COP) structure in which the display driver IC 550 is arranged in a bending portion 540 integrally configured with the flexible substrate 510 of the display panel 430. In one embodiment, the display panel 430 may include a chip on film (COF) structure in which a bending portion 540 in which the display driver IC 550 is arranged is separately manufactured and connected to the display panel 430. In this case, the bending portion 540 may be a part of a flexible printed circuit board (FPCB) arranged inside the electronic device 200. The bending portion 540 may be electrically connected to the flexible substrate 630 (e.g., the flexible substrate 630 illustrated in FIG. 7A) of the electronic device 200, arranged under (e.g., the −Z direction in FIG. 6A) the display panel 430. Accordingly, a signal processed by a processor (e.g., the processor 120 in FIG. 1) electrically connected to the display module 230 may be transmitted to the display panel 430.

According to various embodiments, the bending portion 540 may include a first layer 511 and a second layer 521. The first layer 511 and the second layer 521 may have a laminated relationship. In an embodiment, the first layer 511 may be integrally configured with the flexible substrate 510, and the second layer 521 may be integrally configured with the TFT layer 520. The explanation that the first layer 511 and the second layer 521 are explained separately from the flexible substrate 510 and the TFT layer 520 is only for convenience of explanation. For example, since the first layer 511 is a part where a part of the flexible substrate 510 extends and the second layer 521 is a part where a part of the TFT layer 520 extends, it may be understood that the first layer 511 and the flexible substrate 510 are substantially the same elements and the second layer 521 and the TFT layer 520 are substantially the same elements. The first layer 511 may be at least partially bent to extend to the rear surface of the display module 230. Similarly, the second layer 521 may be at least partially bent in a state of being laminated on the first layer 511 to extend to the rear surface of the display module 230.

Above-described display panel 430 and bending portion 540 are merely distinguished from each other for convenience for description of the disclosure, and may be configured to be physically and electrically connected to each other.

According to various embodiments, a bending-protect layer (BPL) 541 may be disposed on the outer surface of the bending portion 540. The BPL 541 may be made of a flexible material so as to be bent together with the bending portion 540. The BPL 541 may physically and electrically protect the bending area of the bending portion 540. For example, the BPL 541 may be disposed to surround the second layer 521 of the bending portion 540 integrally configured with the TFT layer 520 so as to protect the second layer 521 of the bending portion 540 from an external impact. The BPL 541 may be made of an insulating material and may protect the second layer 521 of the bending portion 540 from the charges accumulated in the electronic device 200.

According to various embodiments, as illustrated in FIG. 6A, in the protection layer 530 of the display panel 430, a part of the protection layer 530 may be removed in an outer region of the protection layer 530 so that a part of the TFT layer 520 is exposed. Here, the outer region may mean the region including the edge of the protection layer 530. In one embodiment, the outer region may have an area of around 10% of the total area of the protection layer 530. For example, referring to FIG. 6A, the protection layer 530 may have a first inclined surface 531-1 so that a part of the TFT layer 520 is exposed in the outside of the protection layer 530, positioned in the first direction (e.g., the −X direction in FIG. 6A) perpendicular to the folding axis A. The first inclined surface 531-1 of the protection layer 530 may be inclined at a predetermined angle with respect to the TFT layer 520. Accordingly, the touch wire 560 patterned in the protection layer 530 may be electrically connected to the touch IC 631 disposed on the flexible substrate 630 electrically connected to the bending portion 540 via the TFT layer 520 and the second layer 521 of the bending portion 540 along the first inclined surface 531-1 in the protection layer 530.

According to various embodiments, the display module 230 may include a deformation region 600 (e.g., a folding region) which deforms in response to a change in relative positions of the first housing 210 and the second housing 220 with respect to each other. In an embodiment, the deformation region 600 may be deformed in response to an operation in which the first housing 210 is folded and unfolded with respect to the second housing 220. For example, the deformation region 600 may mean a folding area 230c of the display module 230 illustrated in FIG. 2A. In another embodiment, the deformation region 600 may be deformed in response to the operation in which the first housing 210 slides with respect to the second housing 220. For example, referring to FIG. 8A and FIG. 8B, the deformation region 600 may mean one region (e.g., the sliding region) of a display module 730 which is deformed by the sliding of a second housing 720 with respect to a first housing 710.

According to various embodiments, the protection layer 530 laminated on the TFT layer 520 may be damaged due to various causes. In an embodiment, the protection layer 530 may be physically damaged by an external impact applied to the electronic device 200. For example, the protection layer 530 may be physically damaged as it is separated from the TFT layer 520 by an external impact. In another embodiment, when the electronic device 200 is exposed to a low-temperature environment, the fluidity of various materials constituting the display panel 430 may decrease. For example, when the display module 230 is folded, the protection layer 530 may be physically damaged as the sticking agents P1, P2, and P3, which reduce the amount of displacement generated in the protection layer 530, solidify. In this case, in a process in which the electronic device 200 illustrated in FIG. 2A is folded and unfolded, the protection layer 530 may be physically damaged as a portion of the protection layer 530 in a region corresponding to the deformation region 600 (e.g., the folding area 230c in FIG. 2A) of the display module 230, is separated from the TFT layer 520.

Meanwhile, when the protection layer 530 is physically damaged, it may be difficult to clearly distinguish whether the protection layer 530 has physically damaged by the external impact applied to the electronic device 200 or whether the protection layer 530 has physically damaged as the electronic device 200 folds and unfolds in a low-temperature environment. In order to determine whether the damage of the protection layer 530 was intervened by the user's fault, it is necessary to identify that the protection layer 530 is exposed to a low temperature and thus damaged.

In various embodiments disclosed herein, a detection wire 610 capable of determining whether or not physical damage has occurred may be arranged in the protection layer 530. In addition, as the operation of folding and unfolding the electronic device 200 in a low-temperature environment is performed, it is possible to provide a method for determining whether the protection layer 530 has been physically damaged. In the following, the operation of the detection wire 610, which detects the physical damage of the protection layer 530, and the processor connected thereto will be described in detail.

According to various embodiments, the detection wire 610 configured to determine whether or not the protection layer 530 laminated on the TFT layer 520 has been physically damaged may be disposed on the display panel 430. In an embodiment, the detection wire 610 extends from the protection layer 530 to the second layer 521 of the bending portion 540 to be electrically connected to a detection circuit (not illustrated) included in the display driver IC 550. The detection wire 610 may be disconnected when the protection layer 530 is physically damaged, such as when the protection layer 530 is separated from the TFT layer 520. The detection circuit connected to the detection wire 610 may detect the electrical value change of the detection wire 610, which occurs when the detection wire 610 is disconnected. Here, the electrical value is a numerical value for identifying the resistance change of the detection wire 610, which occurs when the detection wire 610 is disconnected, and may include a current value and a voltage value. The detection circuit may be electrically connected to a processor electrically connected to the display driver IC 550. The processor may identify the electrical value of the detection wire 610 detected by the detection circuit. When the electrical value identified by the processor corresponds to a preset value, the processor may detect the damage to the protection layer 530.

According to various embodiments, in order for the processor to identify the electrical value of the detection wire 610, the detection wire 610 and the detection circuit should be electrically connected. The detection circuit may be included in the display driver IC 550 connected to the second layer 521 of the bending portion 540. The detection wire 610 may be connected to the detection circuit as it extends to the second layer 521 of the bending portion 540 via the TFT layer 520. To this end, the protection layer 530 may be at least partially removed so that the detection wire 610 extends to the second layer 521 via the TFT layer 520. In an embodiment, the protection layer 530 may remove a partial region of the protection layer 530 so that the TFT layer 520 is exposed in the outside of the protection layer 530. The protection layer 530 may be partially removed to be inclined at a predetermined angle with respect to the TFT layer 520. For example, a second inclined surface 531-2 inclined at a predetermined angle with respect to the TFT layer 520 may be disposed at the end of the protection layer 530. Referring to FIG. 6B, in the protection layer 530, the second inclined surface 531-2 inclined by a predetermined angle with respect to the TFT layer 520 at the upper end (e.g., the +Y direction in FIG. 6B) and the lower end (e.g., the −Y direction in FIG. 6B) of the deformation region 600 of the display module 230.

In an embodiment, the second inclined surface 531-2 may extend in the direction toward the bending portion 540 of the display module 230 so that the detection wire 610 extends to the second layer 521 of the bending portion 540. For example, the second inclined surface 531-2 may extend in the first direction (e.g., the −X direction in FIG. 7A) perpendicular to the folding axis A. Accordingly, the detection wire 610 may be arranged in the protection layer 530 of the display panel 430, and may pass via the outer region of the protection layer 530. For example, the detection wire 610 may be arranged in the protection layer 530 in the deformation region 600 of the display module 230, and may extend along the second inclined surface 531-2 to the second layer 521 of the bending portion 540 integrally configured with the TFT layer 520 via the TFT layer 520. Therefore, the detection wire 610 may be electrically connected to the detection circuit included in the display driver IC 550 as a part of the protection layer 530 is removed.

According to various embodiments, the detection wire 610 may be structurally unstable due to the step between the protection layer 530 and the TFT layer 520. For example, when an external impact is applied to the electronic device 200, the detection wire 610 may be disconnected at the second inclined surface 531-2 due to the step (e.g., the step in the Z-axis direction in FIG. 6B) between the protection layer 530 and the TFT layer 520. According to various embodiments disclosed herein, the detection wire 610 may be configured to have a different thickness depending on the region where the detection wire 610 is arranged. For example, the detection wire 610 arranged on the second inclined surface 531-2 of the protection layer 530 may have a thickness relatively thicker than the detection wire 610 arranged on the protection layer 530 and the TFT layer 520. Therefore, the detection wire 610 of the structural instability due to the step between the protection layer 530 and the TFT layer 520 may be alleviated.

According to various embodiments, the detection wire 610 may be electrically connected to the display driver IC 550 via the outer region of the protection layer 530 in various ways.

According to various embodiments, as illustrated in FIG. 7A, the detection wire 610 may be arranged on the protection layer 530 in the deformation region 600 of the display module 230. In an embodiment, as described above, the deformation region 600 may mean the folding area 230c of the display module 230. In an embodiment, the detection wire 610 may be arranged on the protection layer 530 positioned in the deformation region 600, and extend in an extension direction (e.g., the Y-axis direction in FIG. 7A) of the deformation region 600 toward the outer region of the display module 230. For example, one end of the detection wire 610 may extend in a direction parallel to the extension direction (e.g., the Y-axis direction in FIG. 7A) of the deformation region 600 in the protection layer 530 positioned in the deformation region 600, pass through the second inclined surface 531-2 positioned at the upper end of the display module 230, extend in the first direction (e.g., the −X direction in FIG. 7A) from the TFT layer 520, and pass through the second layer 521 of the bending portion 540 integrally configured with the TFT layer 520 so as to be electrically connected to the detection circuit included in the display driver IC 550. Similarly, the other end of the detection wire 610 may extend in a direction parallel to the extension direction (e.g., the Y-axis direction in FIG. 7A) of the deformation region 600 in the protection layer 530 positioned in the deformation region 600 of the display module 230, pass through the second inclined surface 531-2 positioned at the lower end of the display module 230, extend in the first direction from the TFT layer 520, and pass through the second layer 521 of the bending portion 540 integrally configured with the TFT layer 520 so as to be electrically connected to the detection circuit included in the display driver IC 550. In summary, on the protection layer 530 positioned in the deformation region 600 of the display module 230, the detection wire 610 may be electrically connected to the detection circuit included in the display driver IC 550 along the second inclined surface 532-2 positioned at the upper end and the lower end of the display module 230 via the TFT layer 520 and the second layer 521 of the bending portion 540.

Figure 7B:
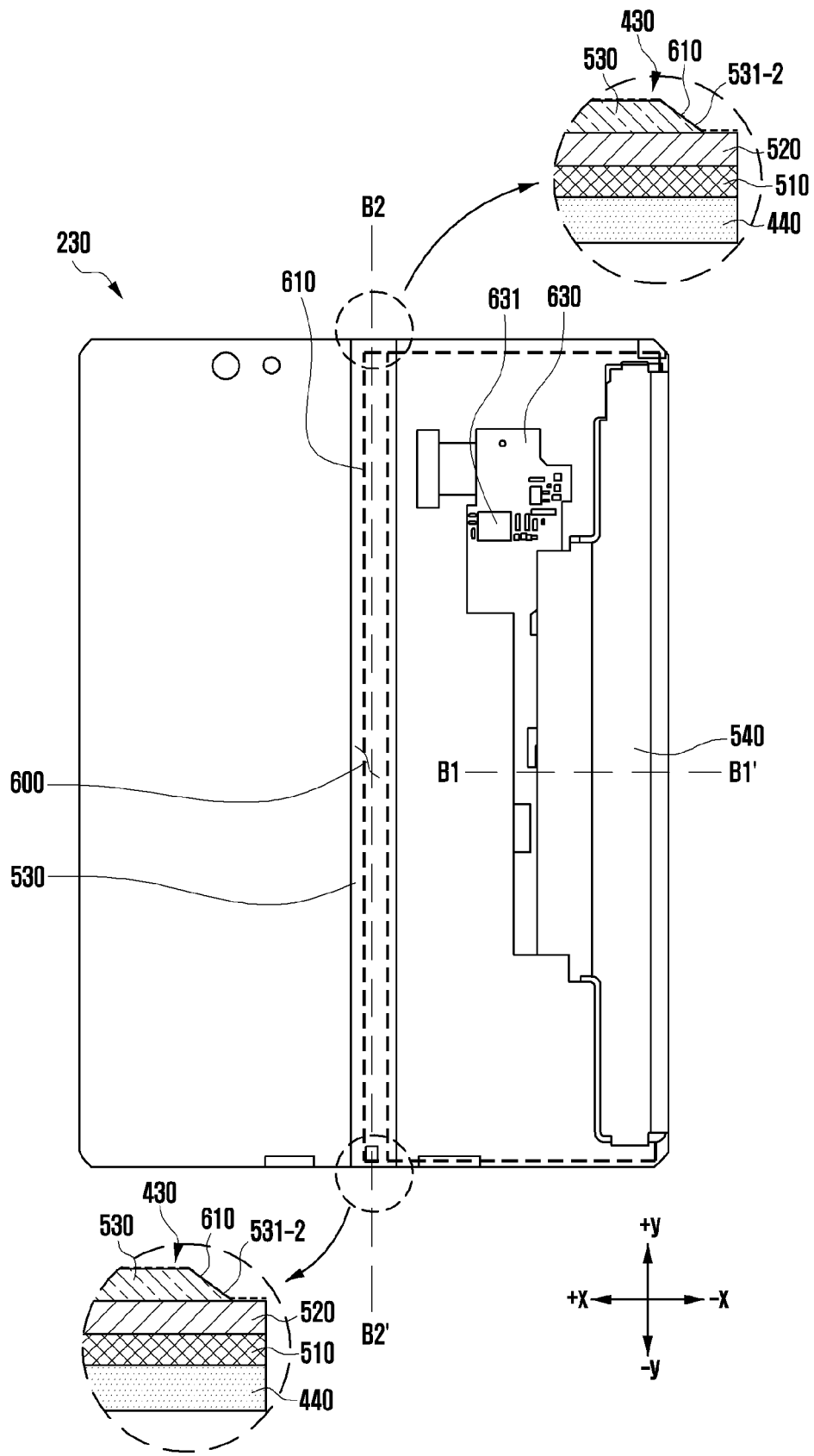

According to various embodiments, as illustrated in FIG. 7B, the detection wire 610 may be arranged in a closed loop shape on the protection layer 530 in the deformation region 600 of the display module 230. The detection wire 610 may extend from the protection layer 530 positioned in the deformation region 600 to the second layer 521 of the bending portion 540 along the outer region of the display module 230 and may be electrically connected to the display driver IC 550. In an embodiment, the detection wire 610 may be arranged in a closed loop shape on the protection layer 530 positioned in the deformation region 600 of the display module 230, and one end of the detection wire 610 may pass through the second inclined surface 531-2 positioned at the upper end of the display module 230 in the second direction (e.g., the Y direction illustrated in FIG. 7B), extend in the first direction (e.g., the −X direction illustrated in FIG. 7B) on the TFT layer 520, and pass through the second layer 521 of the bending portion 540 so as to be electrically connected to the detection circuit of the display driver IC 550. Similarly, the other end of the detection wire 610 may pass through the second inclined surface 531-2 in the second direction (e.g., the −Y direction illustrated in FIG. 7B), extend on the TFT layer 520 in the first direction positioned at the lower end of the display module 230, and pass through the second layer 521 of the bending portion 540 so as to be electrically connected to the detection circuit of the display driver IC 550. In summary, on the protection layer 530 positioned in the deformation region 600 of the display module 230, the detection wire 610 may be electrically connected to the detection circuit included in the display driver IC 550 along the second inclined surface 532-2 positioned at the upper end and the lower end of the display module 230 via the TFT layer 520 and the second layer 521 of the bending portion 540. When the detection wire 610 is arranged on the protection layer 530 in a closed loop shape in the deformation region 600, the effect of arranging the plurality of detection wires 610 in the deformation region 600 may be obtained. Therefore, the damage to the protection layer 530, which is generated in the protection layer 530 positioned in the deformation region 600, may be identified in a wider area.

In another embodiment, the plurality of detection wires 610 may be arranged on the protection layer 530 positioned in the deformation region 600 of the display module 230. In an embodiment, the detection wires 610 may extend in the extension direction (e.g., in the Y-axis direction in FIG. 7A) of the deformation region 600 toward the outer region of the display module 230. One end and the other end of the detection wire 610 may extend in a direction parallel to the extension direction of the deformation region 600, extend in the first direction (e.g., the −X direction illustrated in FIG. 7A) via the second inclined surface 531-2 positioned at the upper end and the lower end of the display module 230, and pass through the second layer 521 of the bending portion 540 integrally configured with the TFT layer 520 so as to be electrically connected to the detection circuit included in the display driver IC 550. As the plurality of detection wires 610 are arranged on the protection layer 530 in the deformation region 600, the damage to the protection layer 530, which is generated in the protection layer 530, may be identified in a wider area.

Figure 7C:
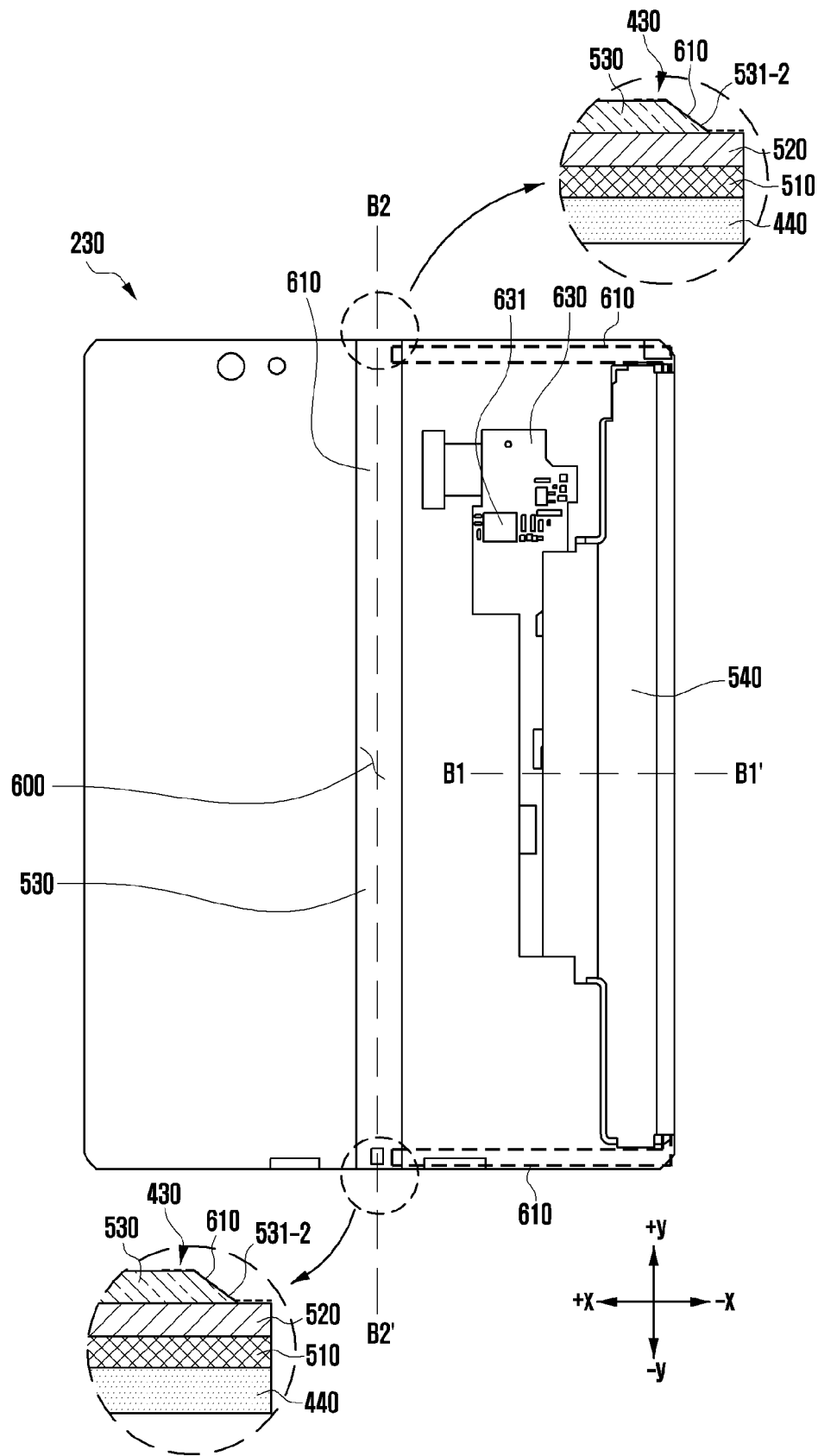

According to various embodiments, as illustrated in FIG. 7C, the plurality of detection wires 610 may be arranged on the protection layers 530 positioned at the upper end (e.g., the +Y direction in FIG. 7C) and the lower end (e.g., the −Y direction in FIG. 7C) of the deformation region 600 of the display module 230, respectively. On the protection layer 530 positioned in the deformation region 600, the plurality of detection wires 610 may extend to the second layer 521 of the bending portion 540 along the outer region of the display module 230 and may be electrically connected to the display driver IC 550. In an embodiment, the detection wire 610 positioned at the upper end of the display module 230 may extend from the detection circuit of the display driver IC 550 to the protection layer 530 positioned at the upper end of the deformation region 600 of the display module 230 via the second layer 521 of the bending portion 540, the TFT layer 520, and the second inclined surface 531-2. The detection wire 610 may pass through the second inclined surface 532-2 again on the protection layer 530 positioned at the upper end of the deformation region 600, extend in the first direction (e.g., the −X direction in FIG. 7C) from the TFT layer 520, and pass through the second layer 521 of the bending portion 540 so as to constitute a closed circuit which is electrically connected to the detection circuit included in the display driver IC 550. Similarly, the detection wire 610 positioned at the lower end of the display module 230 may extend from the detection circuit of the display driver IC 550 to the protection layer 530 positioned at the lower end of the deformation region 600 of the display module 230 via the second layer 521 of the bending portion 540, the TFT layer 520, and the second inclined surface 531-2. The detection wire 610 may pass through the second inclined surface 532-2 again on the protection layer 530 positioned at the lower end of the deformation region 600, extend in the first direction (e.g., the −X direction in FIG. 7C) from the TFT layer 520, and pass through the second layer 521 of the bending portion 540 so as to constitute a closed circuit which is electrically connected to the detection circuit included in the display driver IC 550.

According to various embodiments, the touch wire 560 may include at least one guard wire 620. The guard wire 620 may be electrically connected to at least one ground included in the electronic device 200. The guard wire 620 may move the charges accumulated in the touch wire 560 and the electronic component adjacent to the touch wire 560 to the ground.

Figure 7D:
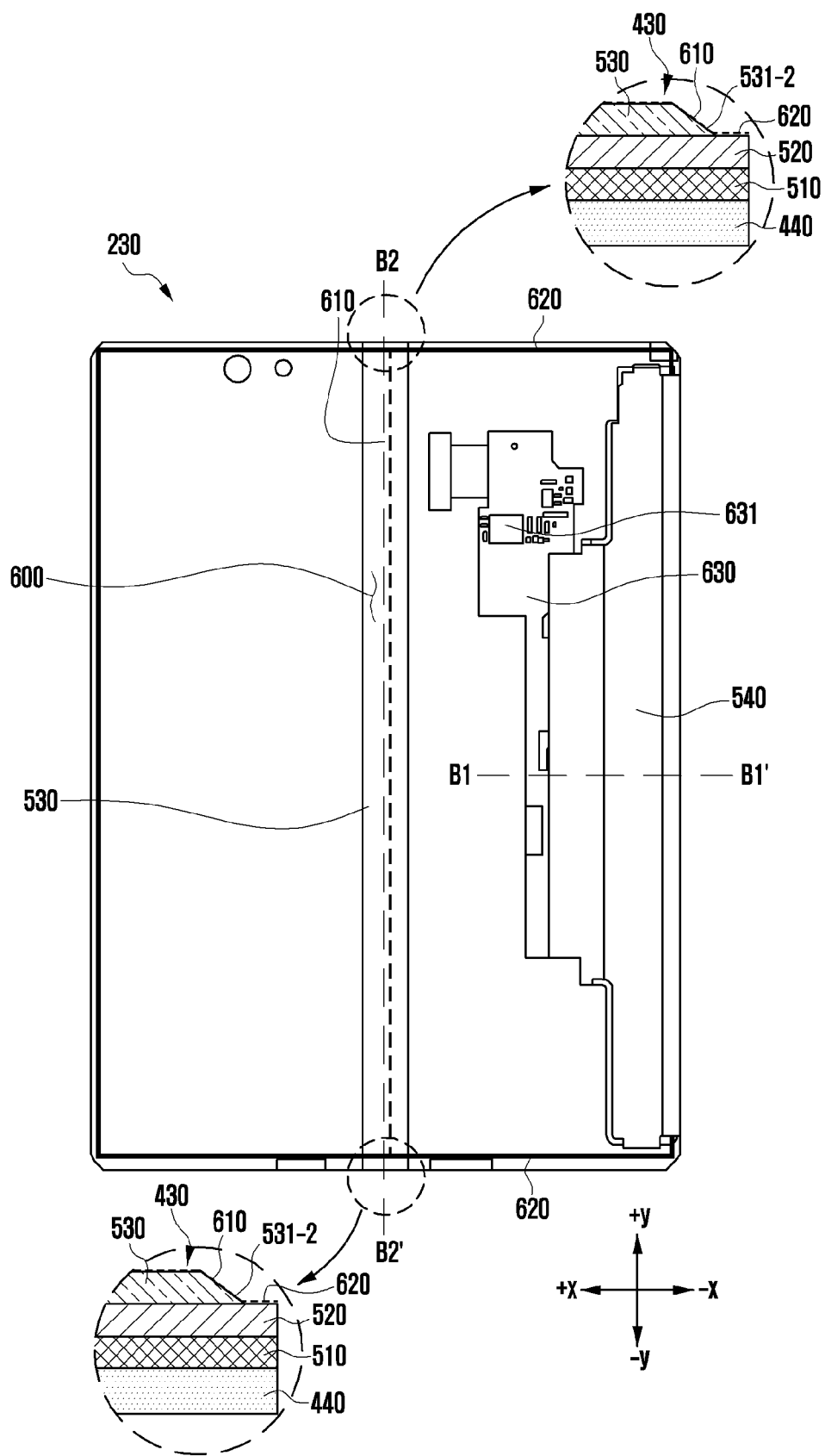

In an embodiment, referring to FIG. 7D, the guard wire 620 may be patterned and arranged in the outside of the protection layer 530 so as to be positioned in the outer region of the display module 230. For example, as illustrated in FIG. 7D, the guard wire 620 may be arranged to surround the outer region of the protection layer 530, and may be electrically connected to the display driver IC 550. The guard wire 620 may be arranged on the TFT layer 520 in the outside of the protection layer 530 and extend along the second inclined surface 531-2 to the second layer 521 of the bending portion 540 integrally configured with the TFT layer 520 so as to be electrically connected to the display driver IC 550. In an embodiment, the detection wires 610 may be arranged on the protection layer 530 in the deformation region 600 to be electrically connected to the guard wire 620. For example, as one end of the detection wire 610 is electrically connected to the guard wire 620 positioned at the upper end of the display module 230 and the other end of the detection wire 610 is electrically connected to the guard wire 620 positioned at the lower end of the display module 230, the detection wire 610 may be electrically connected to the guard wire 620. Therefore, the detection wire 610 may be electrically connected to the detection circuit of the display driver IC 550 via the guard wire 620.

Figure 7E:
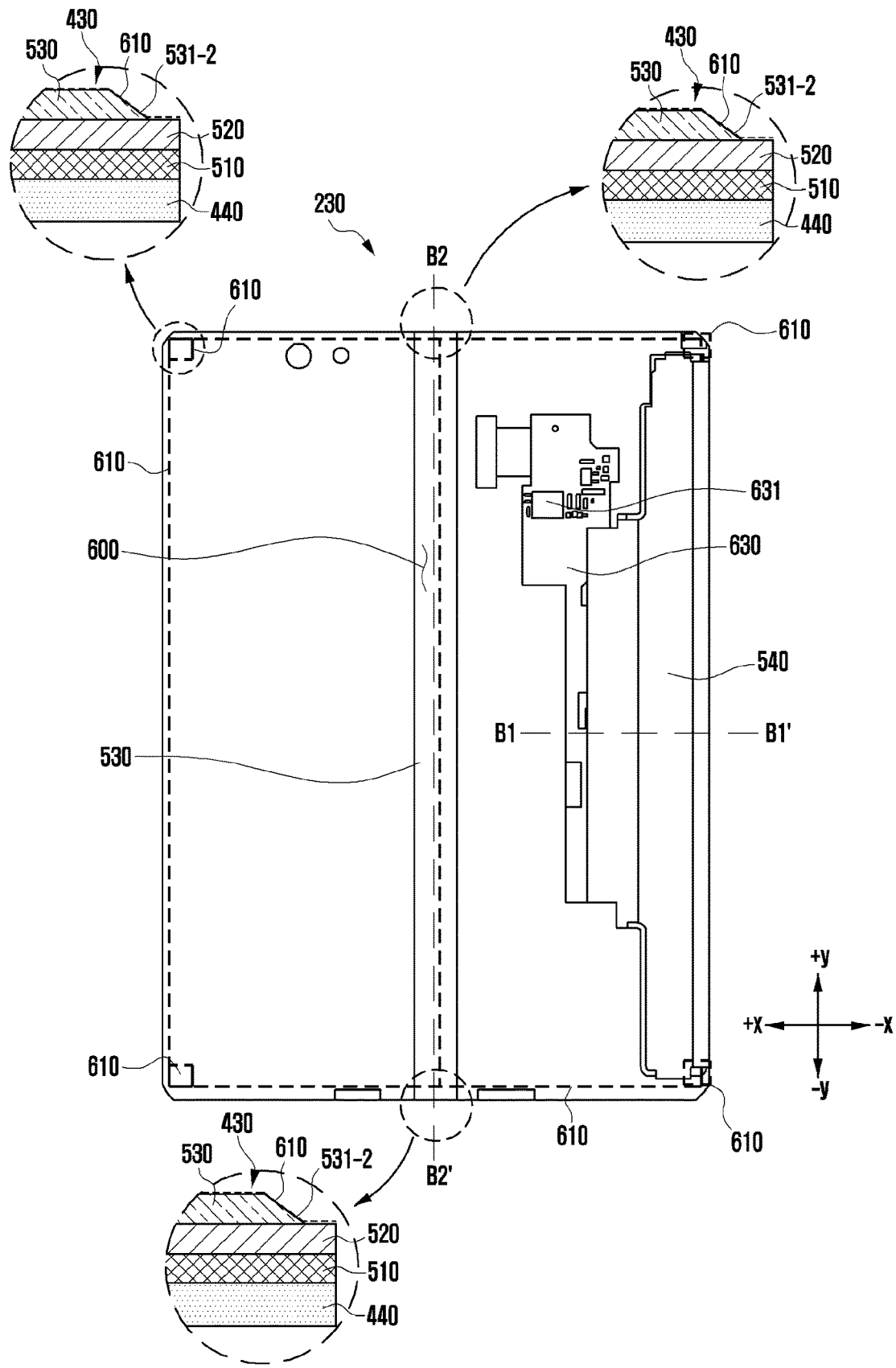

According to various embodiments, as illustrated in FIG. 7E, the detection wire 610 may be arranged on the protection layer 530 positioned in the corner region of the display module 230. The detection wire 610 may extend from the protection layer 530 positioned in the corner region of the display module 230 to the TFT layer 520 via the second inclined surface 531-2 disposed on the protection layer 530 and extend from the TFT layer 520 to the second layer 521 of the bending portion 540 so as to be electrically connected to the detection circuit included in the display driver IC 550. According to various embodiments disclosed herein, as the detection wire 610 is disposed on the protection layer 530 positioned in the corner region of the display module 230, the processor may identify the electrical value change due to the physical damage to the protection layer 530 which occurs in the corner region of the display module 230.

In addition, on the protection layer 530, the detection wire 610 for detecting the physical damage generated in the protection layer 530 may be arranged at various positions.

According to various embodiments disclosed herein, the detection wire 610 configured to determine whether or not the protection layer 530 laminated on the TFT layer 520 has been physically damaged may be arranged on the display panel 430. The detecting wire 610 may be disconnected when the protection layer 530 is physically damaged, such as when the protection layer 530 is separated from the TFT layer 520. The detection circuit included in the display driver IC 550 may detect the electrical value change of the detection wire 610 which occurs due to the disconnection of the detection wire 610. The electrical value of the detection wire 610, which is detected by the detection circuit, may be identified by the processor electrically connected to the display driver IC 550. When the electrical value identified by the processor corresponds to a preset value, the processor may detect the damage to the protection layer 530.

According to various embodiments, the processor electrically connected to the display module 230 may receive the electrical value of the detection wire 610 via the detection circuit electrically connected to the detection wire 610. For example, when the protection layer 530 is physically damaged so that the detection wire 610 is disconnected, the processor may receive the changing electrical value of the detection wire 610 via the detection circuit. The processor may identify whether the received electrical value of the detection wire 610 has reached the preset value. When the identified electrical value corresponds to the preset value, the processor may detect the damage to the protection layer 530. Here, the preset value may be a numerical value preset in the manufacturing process of the electronic device 200 and stored in the memory (e.g., the memory 130 in FIG. 1) of the electronic device 200. In addition, the preset value is a numerical value for identifying the resistance change of the detection wire 610, and may include a current value and a voltage value.

According to various embodiments, the processor may receive the temperature value detected by the temperature sensor included in the electronic device 200. When the electrical value of the detection wire 610, which is identified by the detection circuit, corresponds to the preset value, the processor may determine that the protection layer 530 is damaged and may receive the internal temperature value from the temperature sensor. The processor may identify whether the temperature value measured by the temperature sensor corresponds to the preset temperature range. Here, the preset temperature range may mean a temperature at which the protection layer 530 is damaged when the electronic device 200 operates to change the electronic device 200 in a low-temperature environment. The processor may store, in the memory, the temperature value detected by the temperature sensor and the electrical value detected by the detection circuit when the temperature value detected by the temperature sensor corresponds to the preset temperature range. The processor may transmit the electrical value and the temperature value stored in the memory to an external server.

According to various embodiments, the processor may display a visual interface on the display module 230. In an embodiment, when the electrical value of the detection wire 610, which is transmitted from the detection circuit, corresponds to the preset value, the processor may display, on the display module 230, information that the protection layer 530 has been physically damaged. For example, the display module may display an interface such as "The display module is damaged, please visit a nearby service center". In one embodiment, when the electrical value of the detection wire 610, which is transmitted from the detection circuit, corresponds to the preset value, the processor may display the internal temperature value of the electronic device 200 detected by the temperature sensor on the display module 230 together with the information that the protection layer 530 has been physically damaged.

In various embodiments disclosed herein, it is possible to determine whether or not the protection layer 530 has been physically damaged via the detection wire 610 included in the display panel 430. The processor may receive the changing electrical value of the detection wire 610 via the detection circuit as a result of the protection layer 530 being damaged and the detection wire 610 being disconnected. The processor may receive the temperature value from the temperature sensor when the received electrical value corresponds to the preset value, and may store the electrical value and internal temperature in the memory when the received temperature value corresponds to the preset temperature range.

Hereinafter, an electronic device 700 to be described is the electronic device 700 having another form factor different from the electronic device 200 illustrated in FIG. 2A to FIG. 4, and may include a rollable type or slidable type electronic device 700 in which the area of the display screen of the flexible display module 730 is changeable.

In the following description, the same reference numerals will be used for the components which are the same as or similar to the components described with reference to FIG. 2A to FIG. 7D, and the detailed description thereof will be omitted.

Figure 8A:
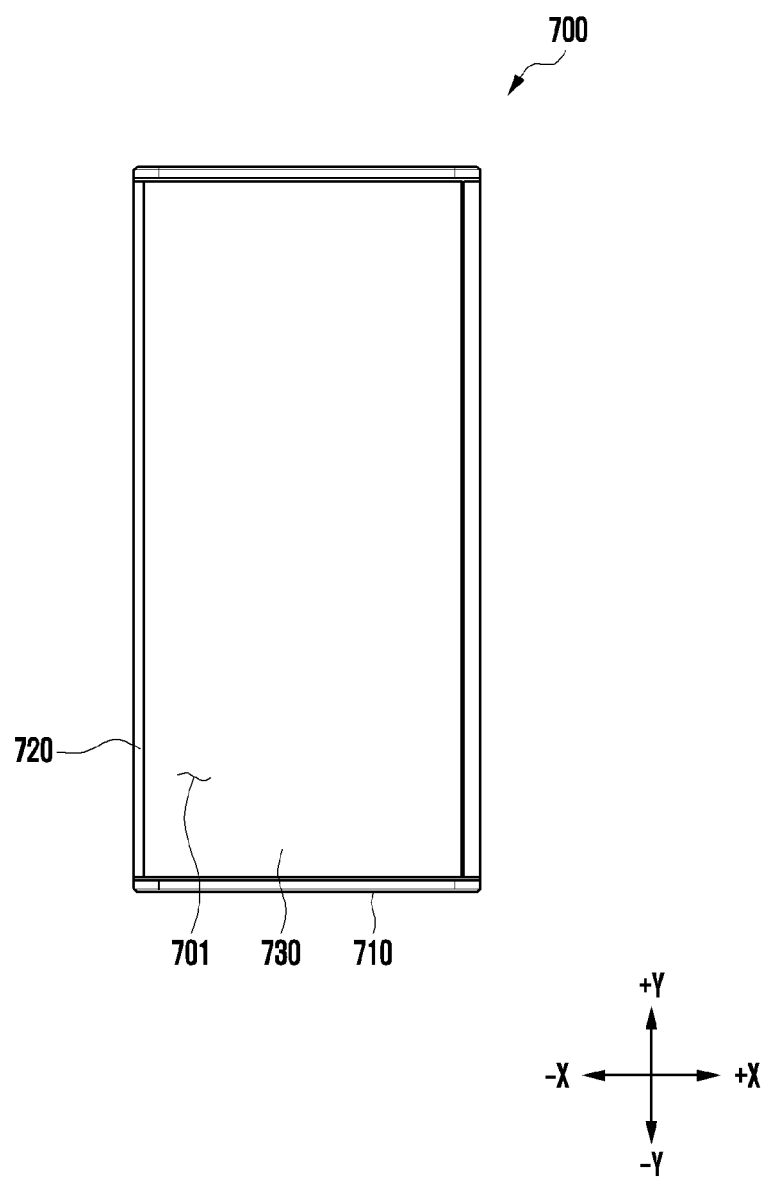
Figure 8B:
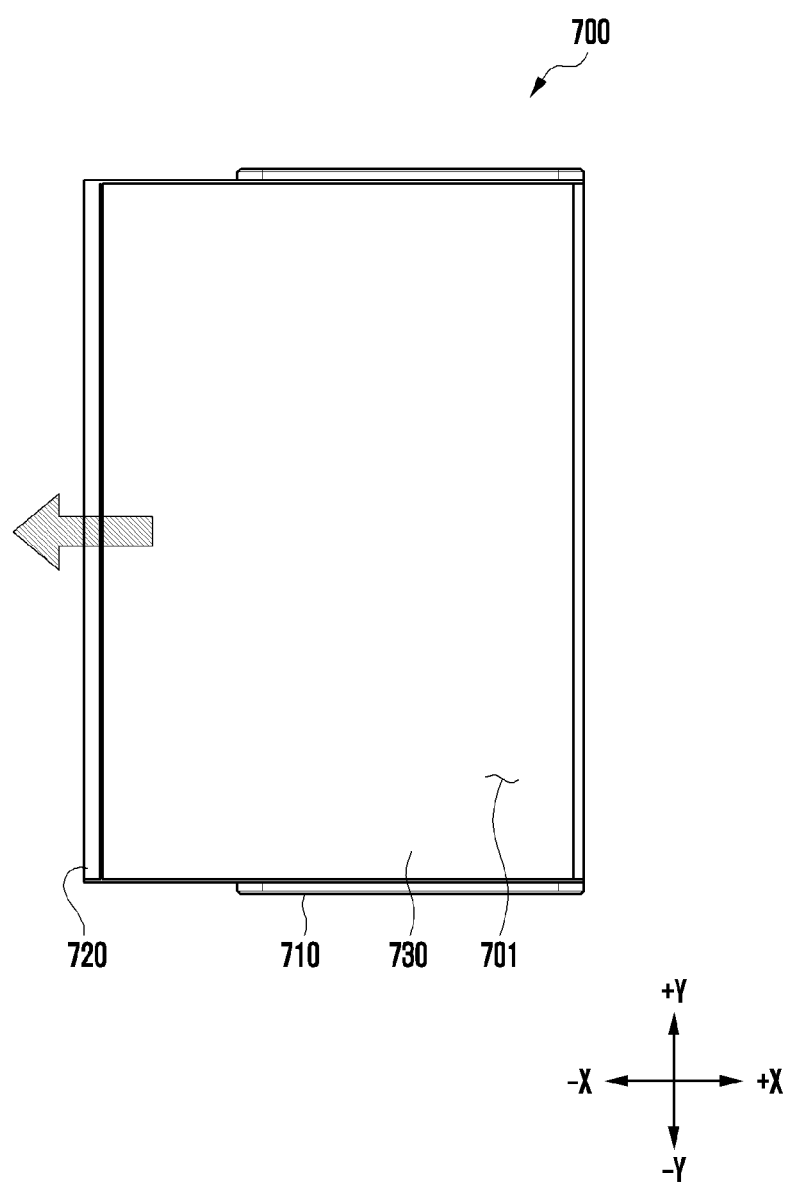
Figure 8D:
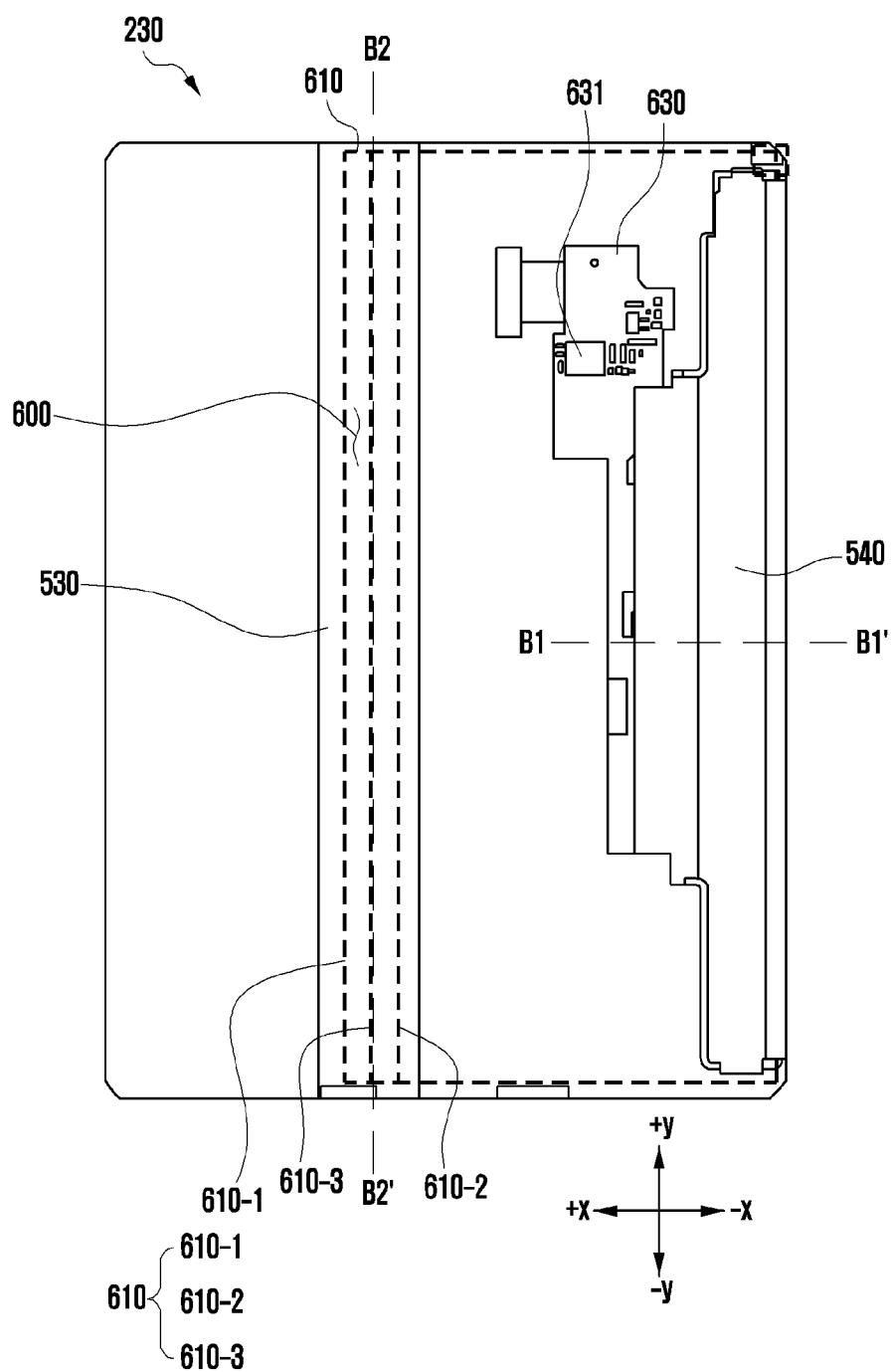
FIG. 8D is a view illustrating an arrangement state of a detection wire included in a display panel of the electronic device illustrated in FIG. 8A to FIG. 8C.

FIG. 8A to FIG. 8C are views for describing various states according to a sliding operation of an electronic device 700 according to various embodiments disclosed herein. FIG. 8D is a view illustrating an arrangement state of a detection wire 610 included in a display panel 430 disposed in the electronic device 700 illustrated in FIG. 8A to FIG. 8C.

According to various embodiments, as illustrated in FIG. 8A and FIG. 8B, the electronic device 700 may be an electronic device 700 implemented such that an information display area 701 of the display module 730 (e.g., the display module 160 in FIG. 1 or the display module 230 in FIG. 2A) is increased or decreased via a sliding method. Here, the information display area 701 may be a portion of the display module 730 (e.g., the display module 160 in FIG. 1 or the display module 230 in FIG. 5), which is visible to the outside of the electronic device 700. The information output to the display module 730 may be visually transmitted to the user via the information display area 701.

According to various embodiments, in the electronic device 700, the information display area 701 may be increased or decreased by the sliding operation. In an embodiment, the sliding operation of the electronic device 700 may mean the sliding of the second housing 720 with respect to the first housing 710. The second housing 720 may slide with respect to the first housing 710 in the +X direction in FIG. 8A and FIG. 8B or in the −X direction in FIG. 8A and FIG. 8B.

According to various embodiments, the electronic device 700 may be changed from a reference state (e.g., the state illustrated in FIG. 8A) to a sliding state (e.g., the state illustrated in FIG. 8B) by the sliding operation.

The reference state may mean a state in which the end of the first housing 710 and the end of the second housing 720 are substantially matched with each other. For example, as illustrated in FIG. 8A, it may mean a state in which the second housing 720 protrudes with respect to the first housing 710 or the first housing 710 does not protrude with respect to the second housing 720. The reference state may mean a state in which the first housing 710 and the second housing 720 are aligned. The reference state may be understood as a closed state or a slide-in state.

The sliding state may mean a state in which the second housing 720 has slid with respect to the first housing 710 in the reference state. The information display area 701 of the display module 730 in the slide state may be larger than the information display area 701 of the display module 730 in the reference state. The slide state may be understood as an opened state or a slide-out state.

The display module 730 in which the information display area 701 is variable according to the sliding operation may be defined as "a slidable display". The display module 730 may be guided by a roller (e.g., the roller 740 in FIG. 8C) described later so that a partial section thereof is bent. The display module 730 which is guided by the roller 740 and whose partial area is bent may be defined as "a rollable display". The display module 730 described below may be understood as a "slidable or rollable display".

According to various embodiments, as illustrated in FIG. 8C, a support member 750 may support a portion of the display module 730. The support member 750 may include a bendable structure. For example, the support member 750 may include a structure in which a plurality of bars configured to extend in a direction (e.g., the Y-axis direction in FIG. 7B) perpendicular to the sliding direction (e.g., the X-axis direction in FIG. 7B) are connected along the sliding direction. In addition, the support member 750 may be configured with various bendable structures. For example, the support member 750 may be a bendable plate and may have a structure in which a plurality of grooves is formed to allow the bending. The support member 750 may be connected to the second housing 720 to be slid with respect to the first housing 710 together with the second housing 720.

According to various embodiments, the display module 730 may include the same configuration as the display module 230 described with reference to FIG. 6A to FIG. 7E. For example, the display module 730 may include the above-mentioned display panel 430 (e.g., the display panel 430 in FIG. 6A) and the bending portion 540 (e.g., the bending portion 540 in FIG. 6A). The display module 730 may include the deformation region 600 (e.g., the deformation region 600 in FIG. 7A) which, like a sliding, deforms in response to a change in relative position between the first housing 710 and the second housing 720.

In an embodiment, when the display panel 430 is exposed to a low-temperature environment, the fluidity of various materials constituting the display panel 430 may decrease. For example, when the display module 730 is rolled, the protection layer 530 may be physically damaged as the sticking agents P1, P2, and P3, which reduce the amount of displacement generated in the protection layer 530, solidify. In this case, a part of the protection layer 530, which corresponds to the deformation region 600 of the display module 730, may be separated from the TFT layer 520 and physically damaged.

According to various embodiments, on the display panel 430 of the display module 730, the detection wire 610 configured to determine whether or not the protection layer 530 laminated on the TFT layer 520 has been physically damaged may be disposed. The detection wire 610 may be disconnected when the protection layer 530 is physically damaged, such as when the protection layer 530 is separated from the TFT layer 520. The detection wire 610 may be electrically connected to the detection circuit electrically connected to the display driver IC 550. The detection circuit connected to the detection wire 610 may detect the electrical value change of the detection wire 610, which occurs when the detection wire 610 is disconnected. The electrical value of the detection wire 610, which is sensed by the detection circuit, may be identified by the processor (e.g., the processor 120 in FIG. 1) electrically connected to the display driver IC 550. When the electrical value identified by the processor corresponds to the preset value, the processor may detect the damage to the protection layer 530.

According to various embodiments, the detection wire 610 may be positioned in the deformation region of the display module 730 in various ways.

According to various embodiments, as illustrated in FIG. 8C, the protection layer may be mainly damaged between a start region 730-1 and an end region 730-2 of the deformation region of the display module 730, where deformation occurs most. At least a part of a region between the start region 730-1 and the end region 730-2 may be bent by the roller 740 in the process in which the electronic device 700 slides. Here, the start region 730-1 and the end region 730-2 may mean a boundary region where deformation occurs in the deformation region of the display module 730. For example, the deformation of the display module 730 due to the sliding operation may occur between the start region 730-1 and the end region 730-2. The positions of the start region 730-1 and the end region 730-2 may be changed in the process in which the electronic device 700 slides. The start region 730-1 may be positioned on the rear surface (e.g., the surface facing the −Z direction with respect to FIG. 8C) of the display module 730, and the end region 730-2 may be positioned on the rear surface (e.g., the surface facing the −Z direction in FIG. 8C) of the display module 730 in all states. As being changed from a slide-in state to a slide-out state, the end region 730-2 may move in the +X direction in FIG. 8C, the start region 730-1 may move in the −X direction in FIG. 8C, and the middle region 730-3 moves from the rear surface to the front surface of the display module 730.

According to various embodiments, the plurality of detection wires 610 may be arranged on the protection layer of the display module 730 to pass through the deformation region between the start region 730-1 and the end region 730-2 of the deformation region 600. For example, a first detection wire 610-*a* may be arranged on the protection layer along the extension direction (e.g., the Y-axis direction in FIG. 8C) of the deformation region so as to pass through the start region 730-1. The second detection wire 610-*b* may be arranged on the protection layer along the extension direction of the deformation region so as to pass through the end region 730-2. A third detection wire 610-*c* may be arranged on the protection layer along the extension direction (e.g., the Y-axis direction in FIG. 8C) of the deformation region so as to pass through the middle region 730-3. The first to third detection wires may extend in the direction (e.g., the Y-axis direction in FIG. 7B) perpendicular to the sliding direction (e.g., the X-axis direction in FIG. 7B) of the display module 730. The physical damage to the protection layer, which has occurred in the start region 730-1, may be detected via the first detection wire 610-*a*, the physical damage to the protection layer, which has occurred in the end region 730-2, may be detected via the second detection wire 610-*b*, and the physical damage, which has occurred in the middle region 730-3, may be detected via the third detection wire 610-*c*. As the plurality of detection wires 610 are arranged on the protection layer to be positioned between the start region 730-1 and the end region 730-2, the physical damage which occurs in the protection layer positioned in the deformation region may be easily identified.

In addition to the configuration described above, the plurality of detection wires 610 may be additionally arranged on the protection layer between the start region 730-1 and the end region 730-2. Therefore, the physical damage occurring in the protection layer 530 may be detected.

According to various embodiments, the detection wire 610 may be arranged in a closed loop shape on the protection layer in the deformation region 600 of the display module 730. In an embodiment, the detection wire 610 may be arranged in a closed loop shape on the protection layer 530 to pass through the start region 730-1, the middle region 730-3, and the end region 730-2 in the deformation region of the display module 730.

Referring to FIG. 8D, the plurality of detection wires 610 may extend from the protection layer 530 positioned in the deformation region 600 to the second layer 521 of the bending portion 540 along the outer region of the display module 730, and may be electrically connected to the display driver IC 550. For example, the plurality of detection wires 610 may have one end which passes through the second inclined surface 531-2 positioned at the upper end (e.g., the +Y direction in FIG. 8D) of the display module 730, extends from the TFT layer 520 in the first direction (e.g., the −X direction illustrated in FIG. 8D), and passes through the second layer 521 of the bending portion 540 so as to be electrically connected to the detection circuit of the display driver IC 550. The plurality of detection wires 610 may have the other end which passes through the second inclined surface 531-2 positioned at the lower end (e.g., the −Y direction in FIG. 8D) of the display module 730, extends from the TFT layer 520 in the first direction, and passes through the second layer 521 of the bending portion 540 so as to be electrically connected to the detection circuit of the display driver IC 550. In summary, on the protection layer 530 positioned in the deformation region 600 of the display module 730, the plurality of detection wires 610 may be electrically connected to the detection circuit included in the display driver IC 550 along the second inclined surface 532-2 positioned at the upper end and the lower end of the display module 730 via the TFT layer 520 and the second layer 521 of the bending portion 540. According to various embodiments disclosed herein, physical damage occurring in the protection layer 530 positioned in the deformation region 600 may be detected via the plurality of detection wires 610. The detection wire 610 may extend from the protection layer 530 positioned in the deformation region 600 to the second layer 521 of the bending portion 540 along the outer region of the display module 730, and may be electrically connected to the display driver IC 550. The detection wire 610 may be arranged in a closed loop shape on the protection layer 530 positioned in the deformation region 600 of the display module 730, and may have one end which passes through the second inclined surface 531-2 positioned at the upper end of the display module 730, extends from the TFT layer 520 in the first direction (e.g., the −X direction illustrated in FIG. 7D), and passes through the second layer 521 of the bending portion 540 so as to be electrically connected to the detection circuit of the display driver IC 550. In addition, the detection wire 610 may have the other end which passes through the second inclined surface 531-2 positioned at the lower of the display module 730, extends from the TFT layer 520 in the first direction, and passes through the second layer 521 of the bending portion 540 so as to be electrically connected to the detection circuit of the display driver IC 550. In summary, on the protection layer 530 positioned in the deformation region 600 of the display module 730, the detection wire 610 may be electrically connected to the detection circuit included in the display driver IC 550 along the second inclined surface 532-2 positioned at the upper end and the lower end of the display module 730 via the TFT layer 520 and the second layer 521 of the bending portion 540. When the detection wire 610 is arranged on the protection layer 530 in a closed loop shape in the deformation region 600, the effect of arranging the plurality of detection wires 610 in the deformation region 600 may be obtained. Therefore, the damage to the protection layer 530, which is generated in the protection layer 530 positioned in the deformation region 600, may be identified in a wider area.

An electronic device 200 (e.g., the electronic device 101 in FIG. 1) according to various embodiments disclosed herein may include a first housing (e.g., the first housing 210 in FIG. 2A or the first housing 710 in FIG. 8A), a second housing (e.g., the second housing 220 in FIG. 2A or the second housing 720 in FIG. 8A) connected to the first housing to be variable in relative position with respect to the first housing, a display module (e.g., the display module 160 in FIG. 1, the display module 230 in FIG. 2A, or the display module 730 in FIG. 8A) including a flexible substrate 510, a thin film transistor (TFT) layer 520 laminated on the flexible substrate 510, a protection layer 530 laminated on the TFT layer 520, and a deformation region 600 which deforms as the relative position of the second housing with respect to the first housing changes, a bending portion 540 including a first layer 511 which is integrally configured with the flexible substrate 510 and at least a part of which is bent to extend to a rear surface (e.g., the surface facing the −Z direction in FIG. 6A) of the display module, and a second layer 521 which is integrally configured with the TFT layer 520, at least a part of which is bent to extend to the rear surface of the display module, and which is laminated on the first layer 511, a display driver IC (DDI) 550 disposed in the bending portion 540, a touch wire 560 disposed on the protection layer 530 to be connected to a touch circuit of the electronic device, and a detection wire 610 disposed on the protection layer 530 in the deformation region 600 and having an electrical value depending on the physical damage to the protection layer 530, where the detection wire 610 extends from the protection layer 530 to the second layer 521 of the bending portion 540 to be electrically connected to the display driver IC 550.

The display driver IC 550 may include a detection circuit which is electrically connected to the detection wire 610 to detect the electrical value of the detection wire, which changes due to the physical damage to the protection layer.

The electronic device may further include: a temperature sensor, a memory (e.g., the memory 130 in FIG. 1), and a processor (e.g., the processor 120 in FIG. 1) electrically connected to the display module, the detection wire, the temperature sensor, and the memory, where the processor identifies the electrical value of the detection wire, which is detected by the detection circuit, controls the temperature sensor to measure the internal temperature of the electronic device when the identified electrical value corresponds to a preset value, and stores the internal temperature and the electrical value of the electronic device in the memory.

The electrical value may include a current value and a voltage value for identifying a resistance change of the detection wire, which occurs when the protection layer is separated from the TFT layer.

An inclined surface 531 inclined at a predetermined angle may be disposed at an end of the protection layer, and the detection wire may be arranged on the TFT layer along the inclined surface of the protection layer and extend to the second layer of the bending portion so as to be electrically connected to the display driver IC.

The detection wire may be arranged to extend in a direction parallel to an extension direction (e.g., the Y-axis direction in FIG. 7A) of the deformation region of the display module, and the inclined surface of the protection layer may be disposed at the upper end (e.g., one end positioned in the +Y direction in FIG. 7A) and the lower end (e.g., the other end positioned in the −Y direction in FIG. 7A) of the deformation region of the display module.

The detection wire may be arranged on the protection layer positioned at the upper end and the lower end of the deformation region of the display module, and extend from the protection layer to the second layer of the bending portion so as to be electrically connected to the display driver IC.

The detection wire arranged on the inclined surface of the protection layer may have a relatively greater thickness than the detection wire arranged on the protection layer and the TFT layer.

The touch wire 560 may include a guard wire 620 electrically connected to at least one ground included in the electronic device, where the guard wire is arranged in an outside of the protection layer, arranged on the TFT layer along the inclined surface, extends to the second layer of the bending portion so as to be electrically connected to the display driver IC, and the detection wire is arranged in the protection layer in the deformation region so as to be electrically connected to the guard wire.

The electronic device may further include a hinge device 320 which foldably connects the first housing and the second housing, where the deformation region of the display module is deformed by folding the first housing and the second housing.

The second housing (e.g., the first housing 710 in FIG. 8A) may be slidably coupled to the first housing (e.g., the second housing 720 in FIG. 8A), where the display module is at least partially fixed to the second housing so that an information display area 701 of the display module, which is a portion visible to the outside of the electronic device, increases or decreases according to the sliding of the second housing, and the deformation region of the display module is a region deformed by the sliding of the second housing with respect to the first housing.

The detection wire may be arranged in a closed loop shape on the protection layer in the deformation region of the display module, and extend from the protection layer to the second layer of the bending portion so as to be electrically connected to the display driver IC.

The bending portion may be made of a flexible material and integrally configured with the display module A method for detecting damage to a display module (e.g., the display module 160 in FIG. 1A, the display module 230 in FIG. 2A, and the display module 730 in FIG. 8A) according to various embodiments disclosed herein may include: receiving an electrical value of the detection wire 610 arranged in the deformation region 600 of the display module, identifying whether the electrical value satisfies a preset value, receiving, based on the identifying, an internal temperature value of the electronic device 200 (e.g., the electronic device 101 in FIG. 1), which is detected by a temperature sensor, and storing the electrical value and the temperature values in a memory 130.

The display module may include a TFT layer 520 and a protection layer 530 laminated on the TFT layer, where the method further includes the operation that a detection circuit of a display driver IC 550 electrically connected to the TFT layer identifies a current value and a voltage value of the detection wire to identify the resistance change which occurs in the detection wire arranged on the protection layer when the protection layer is physically damaged.

The method may further include: identifying whether the temperature value detected by the temperature sensor corresponds to a preset value range, storing the electrical value and the temperature value in the memory when the temperature value corresponds to the preset value range, and transmitting the stored electrical value and temperature value to an external server.

A processor 120 of the electronic device electrically connected to the display module may display an interface related to the physical damage to the protection layer on the display module when the temperature value corresponds to the preset value range.

The display module may include a flexible substrate 510, a TFT layer 520 laminated on the flexible substrate, and a protection layer 530 laminated on the TFT layer, the detection wire may be arranged on the TFT layer along an inclined surface 531 inclined at a predetermined angle at an end of the protection layer positioned in the deformation region of the display module so as to be electrically connected to the display driver IC 550 of the display module, and the operation of receiving the electrical value of the detection wire allows a detection circuit included in the display driver IC of the display module to detect a change in the electrical value of the detection wire so as to detect a physical damage to the protection layer.

The detection wire may extend in a direction (e.g., the Y-axis direction in FIG. 7A) parallel to an extension direction of the deformation region of the display module and may be arranged on the protection layer.

The inclined surface may be disposed at the upper end (e.g., one end positioned in the +Y direction in FIG. 7A) and the lower end (e.g., the other end positioned in the −Y direction in FIG. 7A) of the deformation region of the display module.

The embodiments disclosed in the specification and drawings are merely provided for specific examples to easily explain the technical content according to the embodiments disclosed herein and help the understanding of the embodiments disclosed herein, and are not intended to limit the scope of the embodiments disclosed herein. Therefore, the scope of the various embodiments disclosed herein should be construed that all changes or modified forms derived based on the technical idea of various embodiments disclosed herein in addition to the embodiments disclosed herein are included in the scope of the various embodiments disclosed herein.

The invention claimed is:

1. An electronic device comprising:
   a first housing;
   a second housing connected to the first housing to be variable in relative position with respect to the first housing;
   a display module including a flexible substrate, a thin film transistor (TFT) layer laminated on the flexible substrate, a protection layer laminated on the TFT layer, and a deformation region which deforms as the relative position of the second housing with respect to the first housing changes;
   a bending portion including a first layer which is integrally configured with the flexible substrate and at least a part of which is bent to extend to a rear surface of the display module, and a second layer which is integrally configured with the TFT layer, at least a part of which is bent to extend to the rear surface of the display module, and which is laminated on the first layer;
   a display driver IC (DDI) disposed in the bending portion;
   a touch wire disposed on the protection layer to be connected to a touch circuit of the electronic device; and
   a detection wire disposed on the protection layer in the deformation region and configured to have an electrical value changeable depending on physical damage to the protection layer,
   wherein the detection wire extends from the protection layer to the second layer of the bending portion so as to be electrically connected to the display driver IC, and
   wherein the display driver IC includes a detection circuit electrically connected to the detection wire to detect the electrical value of the detection wire, which changes due to the physical damage to the protection layer.

2. The electronic device of claim 1, further comprising: a temperature sensor; a memory; and a processor electrically connected to the display module, the detection wire, the temperature sensor, and the memory, wherein the processor is configured to identify the electrical value of the detection wire, which is detected by the detection circuit, control the temperature sensor to measure an internal temperature of the electronic device when the identified electrical value corresponds to a preset value, and store the internal temperature and the electrical value of the electronic device in the memory.

3. The electronic device of claim 1,
   wherein the electrical value includes a current value and a voltage value for identifying a resistance change of the detection wire, which occurs when the protection layer is separated from the TFT layer.

4. The electronic device of claim 1,
   wherein an inclined surface inclined at a predetermined angle is disposed at an end of the protection layer, and
   wherein the detection wire is arranged on the TFT layer along the inclined surface of the protection layer and extends to the second layer of the bending portion so as to be electrically connected to the display driver IC.

5. The electronic device of claim 4,
   wherein the detection wire is arranged to extend in a direction parallel to an extension direction of the deformation region of the display module, and
   wherein the inclined surface of the protection layer is disposed at an upper end and a lower end of the deformation region of the display module.

6. The electronic device of claim 4,
   wherein the detection wire is arranged on the protection layer positioned at the upper end and the lower end of the deformation region of the display module, and extends from the protection layer to the second layer of the bending portion so as to be electrically connected to the display driver IC.

7. The electronic device of claim 4,
   wherein the detection wire arranged on the inclined surface of the protection layer has a relatively greater thickness than the detection wire arranged on the protection layer and the TFT layer.

8. The electronic device of claim 4,
   wherein the touch wire includes a guard wire electrically connected to at least one ground included in the electronic device,
   wherein the guard wire is arranged in an outer region of the protection layer, is arranged on the TFT layer along the inclined surface, and extends to the second layer of the bending portion so as to be electrically connected to the display driver IC, and
   wherein the detection wire is arranged on the protection layer in the deformation region so as to be electrically connected to the guard wire.

9. The electronic device of claim 1,
   further comprising:
   a hinge device which foldably connects the first housing and the second housing,
   wherein the deformation region of the display module is deformed by folding the first housing and the second housing.

10. The electronic device of claim 1,
    wherein the first housing is coupled to be slidable with respect to the second housing,
    wherein the display module is at least partially fixed to the first housing so that an information display area of the display module, which is a portion visible to an outside of the electronic device, increases or decreases according to the sliding of the first housing, and
    wherein the deformation region of the display module is a region deformed by the sliding of the first housing with respect to the second housing.

11. The electronic device of claim 10,
    wherein the detection wire is arranged in a closed loop shape on the protection layer in the deformation region of the display module, and extends from the protection layer to the second layer of the bending portion so as to be electrically connected to the display driver IC.

12. The electronic device of claim 1,
    wherein the bending portion is made of a flexible material and integrally configured with the display module.

13. A method for detecting damage to a display module, the method comprising:
    receiving an electrical value of a detection wire arranged in a deformation region of the display module;
    identifying whether the electrical value satisfies a preset value;
    receiving, based on the identifying, an internal temperature value of an electronic device which is detected by a temperature sensor, wherein the electronic device includes the display module; and
    storing the electrical value and the temperature value in a memory, wherein the display module includes a TFT layer and a protection layer laminated on the TFT layer, and wherein the method further comprises: identifying, by a detection circuit of a display driver IC electrically connected to the TFT layer, change in the electrical value of the detection wire which occurs in the detection wire arranged on the protection layer when the protection layer is physically damaged.

14. The method of claim 13, wherein identifying, by the detection circuit of the display driver IC electrically connected to the TFT layer, the change in the electrical value of the detection wire comprises: identifying, by the detection circuit of the display driver IC electrically connected to the TFT layer, a current value and a voltage value of the detection wire to identify a resistance change which occurs in the detection wire arranged on the protection layer when the protection layer is physically damaged.

15. The method of claim 14, further comprising:

identifying whether the temperature value detected by the temperature sensor corresponds to a preset value range;

storing the electrical value and the temperature value in the memory when the temperature value corresponds to the preset value range; and transmitting the stored electrical value and temperature value to an external server.

16. The method of claim 15, wherein a processor of the electronic device electrically connected to the display module displays an interface related to the physical damage to the protection layer on the display module when the temperature value corresponds to the preset value range.

17. The method of claim 13, wherein the display module includes a flexible substrate, a TFT layer laminated on the flexible substrate, and a protection layer laminated on the TFT layer, wherein the detection wire is arranged on the TFT layer along an inclined surface inclined at a predetermined angle at an end of the protection layer positioned in the deformation region of the display module so as to be electrically connected to the display driver IC of the display module, and wherein, in the receiving of the electrical value of the detection wire, a detection circuit included in the display driver IC of the display module detects a change in the electrical value of the detection wire so as to detect a physical damage to the protection layer.

18. The method of claim 17, wherein the detection wire extends in a direction parallel to an extension direction of the deformation region of the display module and is arranged on the protection layer.

19. The method of claim 17, wherein the inclined surface is disposed at an upper end and a lower end of the deformation region of the display module.

* * * * *